US010338575B2

(12) United States Patent
Sato et al.

(10) Patent No.: US 10,338,575 B2
(45) Date of Patent: Jul. 2, 2019

(54) PRODUCTION PROCESSING APPARATUS, PRODUCTION PROCESSING METHOD, AND WORK MANUFACTURING METHOD

(71) Applicant: SONY CORPORATION, Tokyo (JP)

(72) Inventors: Tooru Sato, Chiba (JP); Toshiaki Yofu, Chiba (JP)

(73) Assignee: SONY CORPORATION, Tokyo (JP)

( * ) Notice: Subject to any disclaimer, the term of this patent is extended or adjusted under 35 U.S.C. 154(b) by 36 days.

(21) Appl. No.: 15/520,235

(22) PCT Filed: Aug. 26, 2015

(86) PCT No.: PCT/JP2015/004299
§ 371 (c)(1),
(2) Date: Apr. 19, 2017

(87) PCT Pub. No.: WO2016/067503
PCT Pub. Date: May 6, 2016

(65) Prior Publication Data
US 2017/0351248 A1 Dec. 7, 2017

(30) Foreign Application Priority Data

Oct. 29, 2014 (JP) .................................. 2014-220168

(51) Int. Cl.
*G05B 19/41* (2006.01)
*G05B 19/418* (2006.01)
(Continued)

(52) U.S. Cl.
CPC ........ *G05B 19/4189* (2013.01); *B23P 21/004* (2013.01); *B25J 9/0084* (2013.01);
(Continued)

(58) Field of Classification Search
CPC ... G05B 19/4189; B23P 21/004; B25J 9/0084
See application file for complete search history.

(56) References Cited

U.S. PATENT DOCUMENTS 5,083,070 A * 1/1992 Poupard ........... G05B 19/41815
318/561
2007/0087924 A1* 4/2007 Krosta ................. B23Q 3/1554
483/1
(Continued)

FOREIGN PATENT DOCUMENTS

CN 201940583 U 8/2011
JP 09-104982 A 4/1997
(Continued)

OTHER PUBLICATIONS

Office Action for CN Patent Application No. 201580056916.1, dated Jul. 25, 2018, 7 pages of Office Action and 11 pages of English Translation.

*Primary Examiner* — Vincent H Tran
(74) *Attorney, Agent, or Firm* — Chip Law Group

(57) ABSTRACT

A production processing apparatus according to the present technology includes a first robot arm and a plurality of first tilt tables. The first robot arm is capable of conveying a work. On each of the plurality of first tilt tables, the work conveyed by the first robot arm can be mounted. The plurality of first tilt tables are tilted a predetermined angle from a horizontal surface at positions on a circumference of a circle with the first robot arm being a center, and the work is subjected to production processing in a state where the work is mounted on one of the plurality of first tilt tables.

17 Claims, 17 Drawing Sheets

(51) Int. Cl.
*B23P 21/00* (2006.01)
*B25J 9/00* (2006.01)
*H01L 21/687* (2006.01)

(52) U.S. Cl.
CPC .......... *B25J 9/0096* (2013.01); *G05B 19/418* (2013.01); *H01L 21/68764* (2013.01); *G05B 2219/40238* (2013.01)

(56) References Cited

U.S. PATENT DOCUMENTS

2010/0080676 A1* 4/2010 Niitani .................. B23Q 7/04
414/226.01
2015/0090769 A1* 4/2015 Furuta ............... B23K 37/0461
228/47.1

FOREIGN PATENT DOCUMENTS

| JP | 11-121579 A | 4/1999 |
|----|-------------|--------|
| JP | 2000-100922 | 4/2000 |
| JP | 2000-100922 A | 4/2000 |
| JP | 2007-144524 A | 6/2007 |

* cited by examiner

| Conveyance source No. | Conveyance destination No. |
|---|---|
| 3 | 9 |
| 17 | 1 |
| 10 | 13 |

} Stocked first conveyance patterns

| Conveyance source No. | Conveyance destination No. |
|---|---|
| 108 | 109 |
| 116 | 18 |

} Stocked second conveyance patterns

FIG.14

PRODUCTION PROCESSING APPARATUS, PRODUCTION PROCESSING METHOD, AND WORK MANUFACTURING METHOD

CROSS REFERENCE TO RELATED APPLICATIONS

This application is a U.S. National Phase of International Patent Application No. PCT/JP2015/004299 filed on Aug. 26, 2015, which claims priority benefit of Japanese Patent Application No. JP 2014-220168 filed in the Japan Patent Office on Oct. 29, 2014. Each of the above-referenced applications is hereby incorporated herein by reference in its entirety.

TECHNICAL FIELD

The present technology relates to a technology such as a production processing apparatus that carries out predetermined production processing on a work.

BACKGROUND ART

From the past, there is widely known a production processing apparatus that carries out various types of production processing such as processing, assembling, and inspection on a work on a manufacturing line. While there is a need to convey the work when carrying out the production processing on the work, a robot arm is used for the conveyance in some cases.

Patent Literature 1 below discloses a carriage system that conveys a semiconductor wafer using two rotatable robot arms provided on a frame. This carriage system includes, in a periphery of one of the robot arms, two cassettes that accommodate uninspected semiconductor wafers, two testers that perform a surface inspection of the semiconductor wafers, and an orientation flatness register device. In addition, in a periphery of the other robot arm, the orientation flatness register device described above and 4 inspection-completed cassettes to which the inspected semiconductor wafers are sorted according to an inspection result are provided.

CITATION LIST

Patent Literature

Patent Literature 1: Japanese Patent Application Laid-open No. Hei 11-121579

DISCLOSURE OF INVENTION

Technical Problem

In such a technical field, a technology such as a production processing apparatus capable of realizing miniaturization is being required.

In view of the circumstances as described above, the present technology aims at providing a technology such as a production processing apparatus capable of realizing miniaturization.

Solution to Problem

According to the present technology, there is provided a production processing apparatus including a first robot arm and a plurality of first tilt tables.

The first robot arm is capable of conveying a work.

On each of the plurality of first tilt tables, the work conveyed by the first robot arm can be mounted. The plurality of first tilt tables are tilted a predetermined angle from a horizontal surface at positions on a circumference of a circle with the first robot arm being a center, and the work is subjected to production processing in a state where the work is mounted on one of the plurality of first tilt tables.

In this production processing apparatus, the plurality of first tilt tables are arranged so as to tilt a predetermined angle from the horizontal surface at positions on a circumference of a circle with the first robot arm being a center. Therefore, the entire production processing apparatus can be miniaturized as compared to a case where production processing tables are provided parallel to the horizontal surface.

The production processing apparatus may further include a plurality of first horizontal tables.

On each of the plurality of first horizontal tables, the work conveyed by the first robot arm can be mounted. The plurality of first horizontal tables are parallel to the horizontal surface at positions closer to the first robot arm than the plurality of first tilt tables, and the work is subjected to the production processing in a state where the work is mounted on one of the plurality of first horizontal tables.

In this production processing apparatus, it is possible to appropriately miniaturize the entire production processing apparatus while increasing the number of tables.

The plurality of first tilt tables may each include a lower-side edge portion, and the lower-side edge portions may be arranged at higher positions than the plurality of first horizontal tables.

With this configuration, it is possible to set the positions of the first tilt tables within a movable range of the robot arm while miniaturizing the entire production processing apparatus.

In the production processing apparatus, a tilt angle of the plurality of first tilt tables with respect to the horizontal surface may be 15° or more and 45° or less.

With this configuration, it is possible to maintain stability of works mounted on the first tilt tables while miniaturizing the entire production processing apparatus.

In the production processing apparatus, the plurality of first tilt tables may include a plurality of production processing tables on which the work is subjected to different types of production processing.

With this configuration, different types of production processing can be carried out on the works.

The production processing apparatus may further include a control unit that controls drive of the first robot arm to convey the work with the production processing table that has ended the production processing on the work being a conveyance source and the production processing table corresponding to unprocessed production processing being a conveyance destination out of the plurality of production processing tables.

In the production processing apparatus, the plurality of first tilt tables and the plurality of first horizontal tables may include a plurality of production processing tables on which the work is subjected to different types of production processing.

With this configuration, different types of production processing can be carried out on the works.

The production processing apparatus may further include a control unit that controls drive of the first robot arm to convey the work with the production processing table that has ended the production processing on the work being a conveyance source and the production processing table corresponding to unprocessed production processing being a conveyance destination out of the plurality of production processing tables.

The production processing apparatus may further include a first production processing unit and a second production processing unit.

The first production processing unit includes the first robot arm and the plurality of first tilt tables.

The second production processing unit includes a second robot arm and a plurality of second tilt tables.

The second robot arm is capable of conveying the work.

On each of the plurality of second tilt tables, the work conveyed by the second robot arm can be mounted. The plurality of second tilt tables are tilted a predetermined angle from the horizontal surface at positions on a circumference of a circle with the second robot arm being a center, and the work is subjected to production processing in a state where the work is mounted on one of the plurality of second tilt tables.

In this production processing apparatus, the production processing can efficiently be carried out on the works using the two production processing units.

In the production processing apparatus, the second production processing unit may further include a plurality of second horizontal tables.

On the plurality of second horizontal tables, the work conveyed by the second robot arm can be mounted. The plurality of second horizontal tables are parallel to the horizontal surface at positions closer to the second robot arm than the plurality of second tilt tables, and the work is subjected to the production processing in a state where the work is mounted on one of the plurality of second horizontal tables.

In this production processing apparatus, it is possible to appropriately miniaturize the entire production processing apparatus while increasing the number of tables.

The production processing apparatus may further include a storage unit and a control unit.

The control unit successively stocks, in the storage unit every time a conveyance condition is satisfied, a first conveyance pattern in which information on a conveyance source from which the work is taken out by the first robot arm and information on a conveyance destination on which the work is mounted by the first robot arm are associated with each other, and successively stocks, in the storage unit every time the conveyance condition is satisfied, a second conveyance pattern in which information on a conveyance source from which the work is taken out by the second robot arm and information on a conveyance destination on which the work is mounted by the second robot arm are associated with each other.

The control unit also determines whether an interference, in which the conveyance source of the first conveyance pattern and the conveyance source of the second conveyance pattern are the same or the conveyance destination of the first conveyance pattern and the conveyance destination of the second conveyance pattern are the same, has occurred, and causes, when the interference has occurred, the first robot arm to execute conveyance by the first conveyance pattern involving the interference, deletes the second conveyance pattern involving the interference from the storage unit, and causes the second robot arm to execute conveyance by other second conveyance patterns stocked in the storage unit.

In this production processing apparatus, when the interference has occurred, the first robot arm executes conveyance in the first conveyance pattern involving the interference. On the other hand, the second conveyance pattern involving the interference is deleted from the storage unit, and the second robot arm executes conveyance by other second conveyance patterns stocked in the storage unit.

With this configuration, when the interference has occurred, the second robot arm can execute the next conveyance operation without waiting for completion of the work conveyance operation by the first robot arm, and eventually raise production efficiency.

The production processing apparatus may further include a supply unit and a discharge unit.

The supply unit includes a supply area for commonly supplying the work to the first production processing unit and the second production processing unit.

The discharge unit includes a discharge area for commonly discharging the work that has ended the production processing in the first production processing unit and the work that has ended the production processing in the second production processing unit.

In this case, the control unit determines that the interference has occurred when the supply area is commonly set as the conveyance source in the first conveyance pattern and the second conveyance pattern or when the discharge area is commonly set as the conveyance destination in the first conveyance pattern and the second conveyance pattern.

While an interference occurs in the supply area and the discharge area in this production processing apparatus, when such an interference occurs, the second robot arm can execute the next conveyance operation without waiting for completion of the work conveyance operation by the first robot arm.

In the production processing apparatus, the control unit may determine whether the first conveyance pattern is stocked in the storage unit, execute a search on whether an executable first conveyance pattern exists when the first conveyance pattern is not stocked in the storage unit, and stock, when the executable first conveyance pattern exists, the first conveyance pattern in the storage unit and cause the first robot arm to execute conveyance by the first conveyance pattern.

With this configuration, it is possible to prevent an executable conveyance pattern from being overlooked.

In the production processing apparatus, the control unit may determine whether the second conveyance pattern is stocked in the storage unit, execute a search on whether an executable second conveyance pattern exists when the second conveyance pattern is not stocked in the storage unit, and stock, when the executable second conveyance pattern exists, the second conveyance pattern in the storage unit and cause the second robot arm to execute conveyance by the second conveyance pattern.

With this configuration, it is possible to prevent an executable conveyance pattern from being overlooked.

According to the present technology, there is provided a production processing method including holding a work by a first robot arm.

The work held by the first robot arm is mounted on any of a plurality of first tilt tables that are tilted a predetermined angle from a horizontal surface at positions on a circumference of a circle with the first robot arm being a center.

The work mounted on the first tilt table is subjected to production processing.

According to the present technology, there is provided a program that causes a production processing apparatus to execute the steps of:

holding a work by a first robot arm;

mounting the work held by the first robot arm on any of a plurality of first tilt tables that are tilted a predetermined angle from a horizontal surface at positions on a circumference of a circle with the first robot arm being a center; and subjecting the work mounted on the first tilt table to production processing.

According to the present technology, there is provided a work manufacturing method including holding a work by a first robot arm.

The work held by the first robot arm is mounted on any of a plurality of first tilt tables that are tilted a predetermined angle from a horizontal surface at positions on a circumference of a circle with the first robot arm being a center.

The work mounted on the first tilt table is subjected to production processing.

Advantageous Effects of Invention

As described above, according to the present technology, a technology such as a production processing apparatus capable of realizing miniaturization can be provided.

BRIEF DESCRIPTION OF DRAWINGS

FIG. 14 A diagram showing an example of conveyance patterns stored in a PLC storage unit.

MODES FOR CARRYING OUT THE INVENTION

Hereinafter, an embodiment of the present technology will be described with reference to the drawings.

<Entire Configuration of Production Processing Apparatus 100 and Configuration of Respective Units>

Figure 1:
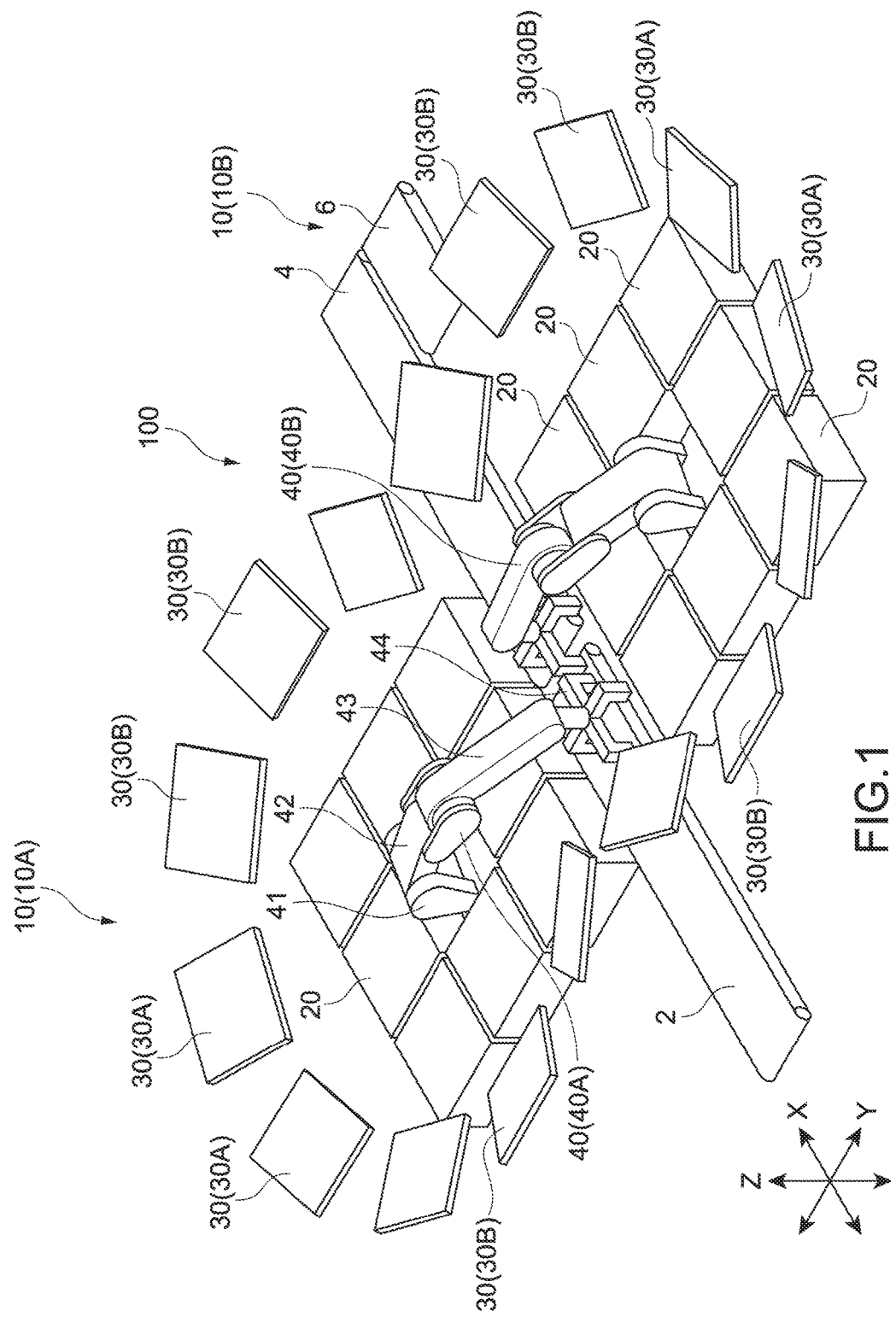
FIG. 1 A perspective view of a production processing apparatus according to an embodiment.
Figure 2:
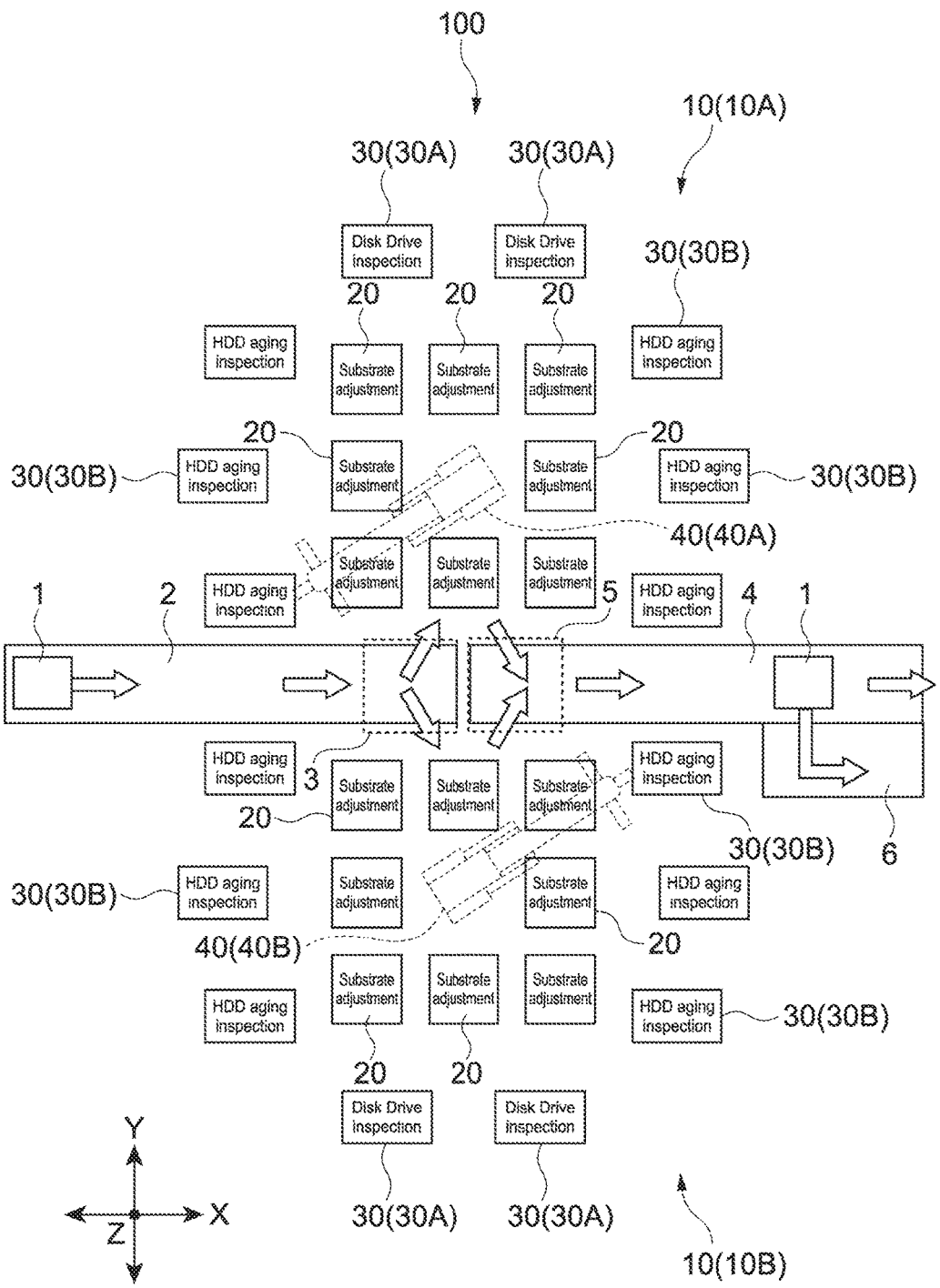
FIG. 2 A schematic view of the production processing apparatus from above.
Figure 3:
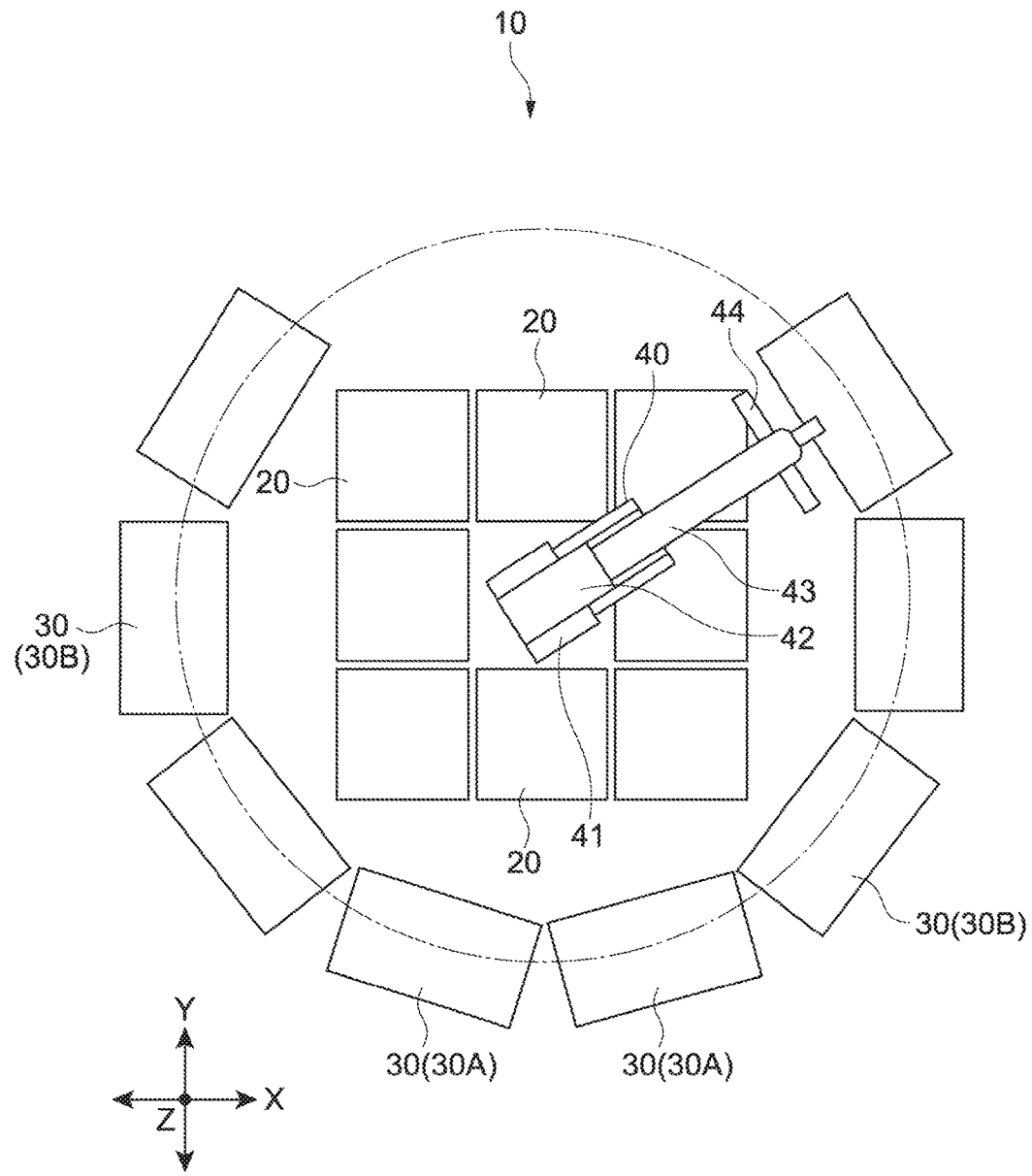
FIG. 3 A schematic view of one of two production processing units of the production processing apparatus from above.
Figure 4:
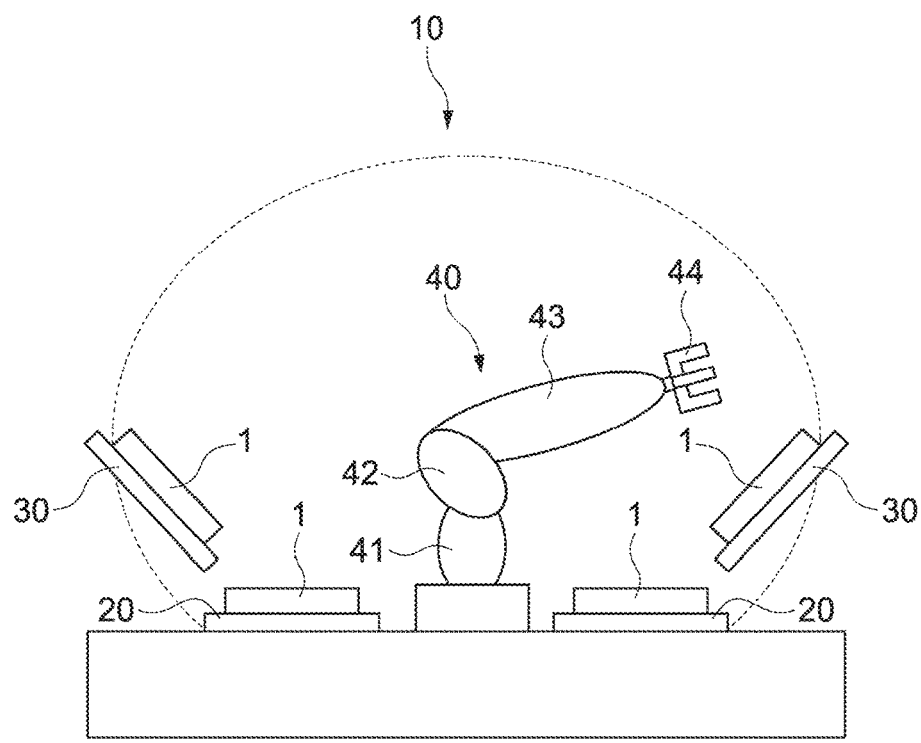
FIG. 4 A schematic side view of one of the two production processing units of the production processing apparatus.

FIG. 1 is a perspective view of a production processing apparatus 100 according to this embodiment. FIG. 2 is a schematic view of the production processing apparatus 100 from above. FIG. 3 is a schematic view of one of two production processing units 10 of the production processing apparatus 100 from above. FIG. 4 is a schematic side view of one of the two production processing units 10 of the production processing apparatus 100.

As shown in the figures, the production processing apparatus 100 of this embodiment includes a supply conveyor 2 (supply unit) that supplies a work 1, a discharge conveyor 4 (discharge unit) that discharges the work 1, and two production processing units 10 that carry out predetermined production processing on the work 1.

Here, when it is necessary to distinguish the two production processing units 10 of the production processing apparatus 100 from each other in the descriptions of this embodiment, one of the production processing units 10 will be referred to as first production processing unit 10A, and the other one of the production processing units 10 will be referred to as second production processing unit 10B.

The supply conveyor 2 and the discharge conveyor 4 each have a shape elongated in one direction and are arranged so as to be aligned on a straight line along the longitudinal direction. The supply conveyor 2 is capable of intermittently moving the work 1 placed on the supply conveyor 2 in the longitudinal direction thereof and moving the work 1 to a supply area 3 (see broken line of FIG. 2) arranged on a one end portion side of the longitudinal direction.

In the supply area 3, the work 1 is commonly supplied to the first production processing unit 10A and the second production processing unit 10B. An optical sensor for detecting whether the work 1 is present in the supply area 3 is provided in the supply area 3.

The discharge conveyor 4 includes, at a position on a one end portion side of the longitudinal direction, a discharge area 5 (see broken line of FIG. 2) from which the work 1 that has been subjected to production processing by the first production processing unit 10A and the second production processing unit 10B is commonly discharged. An optical sensor for detecting whether the work 1 is present in the discharge area 5 is provided in the discharge area 5. The discharge conveyor 4 is capable of intermittently moving the work 1 placed in the discharge area 5 in the longitudinal direction thereof to guide the work 1 to a discharge port.

At a position on the other end portion side of the discharge conveyor 4, a defective-item discharge conveyor 6 is arranged so as to be parallel to the discharge conveyor 4 in a width direction. The defective-item discharge conveyor 6 is capable of guiding the work 1 determined as a defective item by an inspection of the work 1 as one process of the production processing to a defective-item discharge port.

The first production processing unit 10A and the second production processing unit 10B are formed to be symmetric with respect to the supply conveyor 2 and the discharge conveyor 4.

The production processing units 10 each include a robot arm 40 arranged at a center of the production processing unit 10, a plurality of horizontal tables 20 arranged in a periphery of the robot arm 40, and a plurality of tilt tables 30 arranged at positions on a circumference of a circle about the robot arm 40.

The plurality of horizontal tables 20 are arranged parallel to a horizontal surface at positions closer to the robot arm 40 than the plurality of tilt tables 30. On the other hand, the plurality of tilt tables 30 are arranged so as to tilt a predetermined angle from the horizontal surface at positions farther away from the robot arm 40 than the plurality of horizontal tables 20.

Further, the plurality of tilt tables 30 are arranged one step higher than the plurality of horizontal tables 20. Specifically, lower-side edge portions of the plurality of tilt tables 30 are arranged to be higher than the plurality of horizontal tables 20.

To make it easier to understand by other things, the production processing units 10 of this embodiment each have a structure like a baseball stadium or soccer stadium (2-stories structure) (horizontal tables 20 are ground, tilt tables 30 are spectators' stands, and robot arm 40 is provided at center of ground).

The robot arm 40 is configured such that the entire arm is rotatable in forward and reverse directions about an axis in a vertical direction. The robot arm 40 is also configured such that respective units thereof are rotatable about an axis in the horizontal direction. Accordingly, the robot arm 40 can be extended and contracted.

The robot arm 40 includes a base portion 41, a first arm portion 42 rotatable about the horizontal axis with respect to the base portion 41, a second arm portion 43 rotatable about the horizontal axis with respect to the first arm portion 42, and a hand portion 44 rotatable about the horizontal axis with respect to the second arm portion 43.

The hand portion 44 includes a first clamp mechanism that clamps the work 1 from sides and a second clamp mechanism that clamps the work 1 from sides in a direction orthogonal to the direction in which the first clamp mechanism clamps the work 1. The hand portion 44 can stably hold the work 1 by clamping the work 1 by the first clamp mechanism and the second clamp mechanism in the directions orthogonal to each other.

In this embodiment, the number of horizontal tables 20 is 8, and the number of tilt tables 30 is also 8. However, the numbers of horizontal tables 20 and tilt tables 30 are not limited in particular and can be changed as appropriate.

In this embodiment, the 8 horizontal tables 20 are substrate adjustment tables (production processing tables) 20 that mainly adjust a substrate mounted on the work 1. Further, in this embodiment, 2 of the 8 tilt tables 30 are disc drive inspection tables (production processing tables) 30A mainly used for performing an inspection of a disc drive (optical drive) 56 mounted on the work 1, and 6 of the 8 tilt tables 30 are HDD aging inspection tables (production processing tables) 30B mainly used for performing an aging inspection of an HDD (Hard Disk Drive) 55.

The number of tables 20 and that of tables 30 are set in accordance with processing times of the work 1 in the tables 20 and 30. Specifically, the numbers are set relatively largely for the tables 20 and 30 that require long processing times, and the numbers are set to be relatively small for the tables 20 and 30 that require short processing times.

In other words, in this embodiment, the processing times of the work 1 in the tables 20 and 30 satisfy "processing time in substrate adjustment tables 20<processing time in HDD aging inspection tables 30B<processing time in disc drive inspection tables 30A".

Also in this embodiment, the order in which the work 1 passes the tables 20 and 30 is set to be in the stated order of the substrate adjustment tables 20→the disc drive inspection tables 30A→the HDD aging inspection tables 30B, and conveyance of the work 1 by the robot arm 40 is also carried out in that order.

Here, when it is necessary to distinguish the robot arm 40 of the first production processing unit 10A and the robot arm 40 of the second production processing unit 10B from each other in the descriptions of this embodiment, the robot arm 40 of the first production processing unit 10A will be referred to as first robot arm 40A, and robot arm 40 of the second production processing unit 10B will be referred to as second robot arm 40B. It should be noted that the same holds true for the tables 20 and 30.

Figure 5:
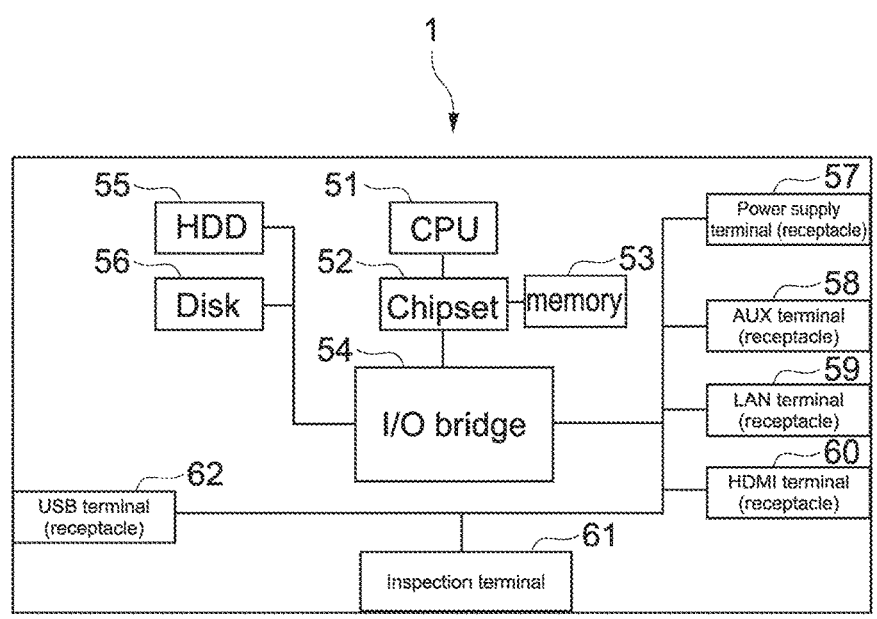
FIG. 5 A block diagram showing an electrical configuration of a work.

FIG. 5 is a block diagram showing an electrical configuration of the work 1. It should be noted that the work 1 subjected to the production processing in the production processing apparatus 100 of this embodiment is an equipping-type game device (manufacturing stage) used by being connected to a television apparatus or the Internet. The work 1 includes a thin cuboid casing.

As shown in FIG. 5, the work 1 of this embodiment includes a CPU 51 (Central Processing Unit), a chipset 52 connected to the CPU 51, a main memory 53 (e.g., RAM (Random Access Memory)) connected to the chipset 52, and an I/O bridge (I/O: Input/output). The work 1 also includes the HDD 55 and disc drive (optical drive) 56 connected to the I/O bridge 54.

The work 1 also includes a receptacle-side power supply terminal 57, a receptacle-side AUX terminal 58 (AUX: Auxiliary), a receptacle-side LAN terminal 59 (LAN: Local Area Network), and a receptacle-side HDMI terminal 60 (HDMI (registered trademark): High-Definition Multimedia Interface), that are connected to the I/O bridge 54. The work 1 also includes an inspection terminal 61 and a receptacle-side USB terminal 62 (USB: Universal Serial Bus).

It should be noted that out of the respective units of the work 1, the CPU 51, the chipset 52, the main memory 53, the I/O bridge 54, and the inspection terminal 61 are mounted on a substrate. Here, the receptacle-side power supply terminal 57, the receptacle-side AUX terminal 58, the receptacle-side LAN terminal 59, and the receptacle-side HDMI terminal 60 are exposed from one side surface of the casing. On the other hand, the receptacle-side USB terminal 62 is exposed from the other side surface of the casing. Moreover, the inspection terminal 61 is exposed from a lower surface of the casing.

Figure 6:
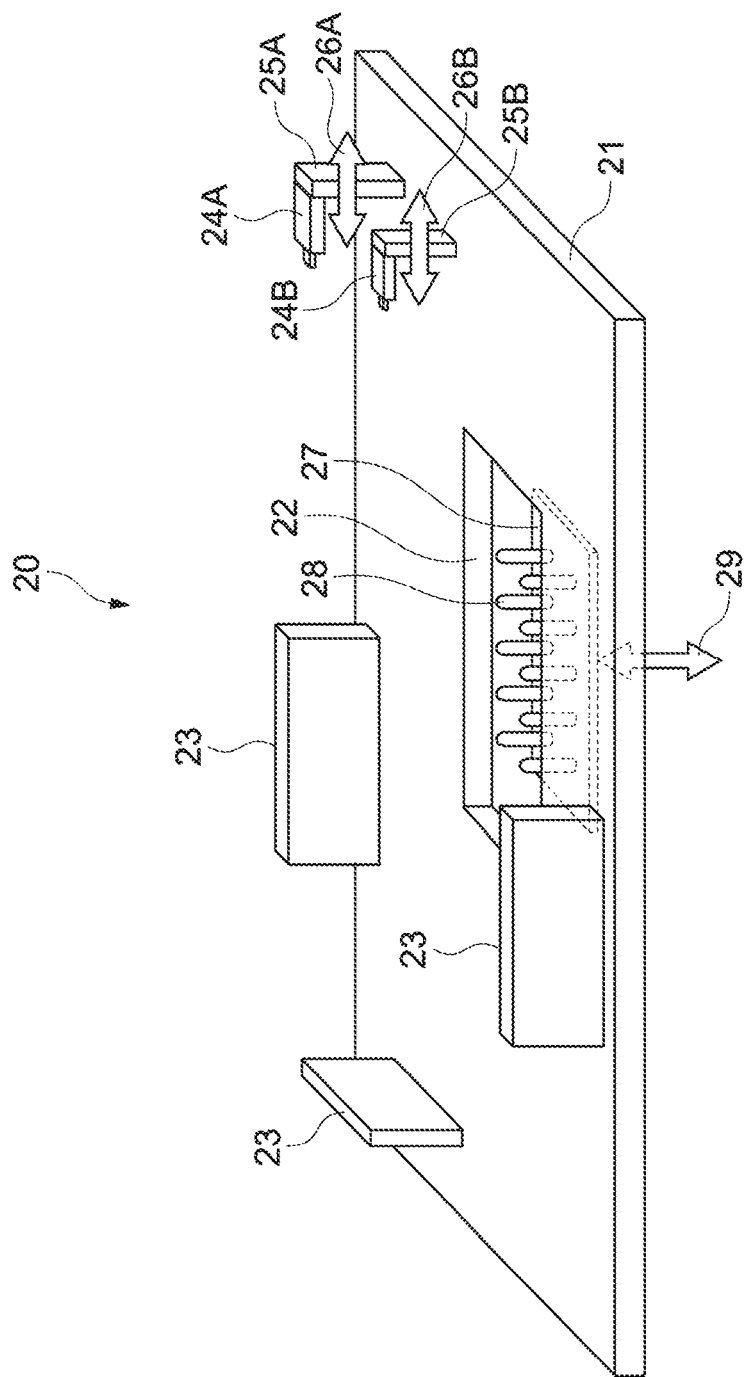
FIG. 6 A schematic perspective view of a substrate adjustment table.
Figure 7:
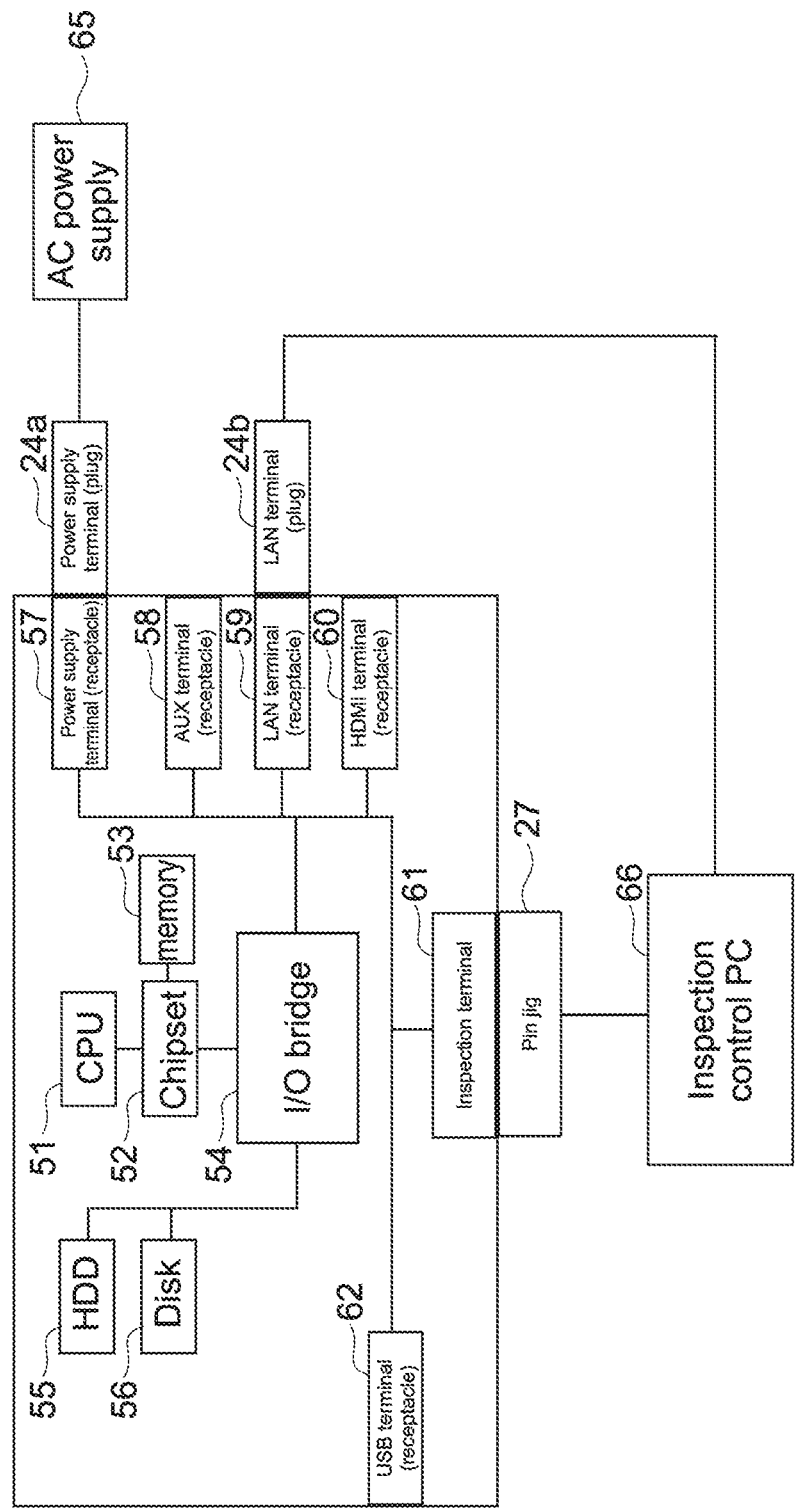
FIG. 7 An electrical block diagram showing a state where a work 1 is mounted on the substrate adjustment table.

FIG. 6 is a schematic perspective view of the substrate adjustment table 20. FIG. 7 is an electrical block diagram showing a state where the work 1 is mounted on the substrate adjustment table 20.

The substrate adjustment table 20 includes a table 21, 3 wall portions 23 erected on the table 21, a power supply plug 24A, a LAN plug 24B, a first holding body 25A that holds the power supply plug 24A, and a second holding body 25B that holds the LAN plug 24B. The substrate adjustment table 20 also includes a first horizontal movement mechanism 26A that moves the first holding body 25A in a longitudinal direction of the table 21 and a second horizontal movement mechanism 26B that moves the second holding body 25B in the longitudinal direction of the table.

The substrate adjustment table 20 also includes a pin jig 27 arranged below the table 21 and a vertical movement mechanism 29 that moves the pin jig 27 in the vertical direction.

The table 21 is a rectangular plate-like member that has a size in which the work 1 can be mounted. An opening 22 for vertically moving the pin jig 27 is provided near the center of the table 21.

Positions of the 3 wall portions 23 provided on the table 21 are set so that the work 1 can be mounted at an appropriate position on the table 21. Of the 3 wall portions 23, 2 wall portions 23 facing each other may be configured to be movable in a direction in which they are brought close to and set apart from each other.

The power supply plug 24A includes a plug-side power supply terminal 24a that is connected to the receptacle-side power supply terminal 57 mounted on the work 1 and is connected to an AC power supply 65 (commercial power supply) (AC: Alternating Current). Further, the LAN plug 24B includes a plug-side LAN terminal 24b that is connected to the receptacle-side LAN terminal 59 mounted on the work 1 and is connected to an inspection control PC 66 (Personal Computer).

The first horizontal movement mechanism 26A moves the first holding body 25A holding the power supply plug 24A in the longitudinal direction of the table 21 to move the power supply plug 24A between a standby position and a connection position. Similarly, the second horizontal movement mechanism 26B moves the second holding body 25B holding the LAN plug 24B in the longitudinal direction of the table 21 to move the LAN plug 24B between a standby position and a connection position.

The pin jig 27 includes a plurality of pins 28 to be connected to the inspection terminal 61 provided in the work 1 and is connected to the inspection control PC 66. The vertical movement mechanism 29 moves the pin jig 27 in the vertical direction to move the pin jig 27 between a standby position and a connection position.

The inspection control PC 66 includes at least a control unit (e.g., CPU), a storage unit, and a communication unit. The storage unit includes a volatile memory (e.g., RAM) that is used as a working area of the control unit and a nonvolatile memory (e.g., ROM (Read Only Memory)) that fixedly stores various programs.

Figure 8:
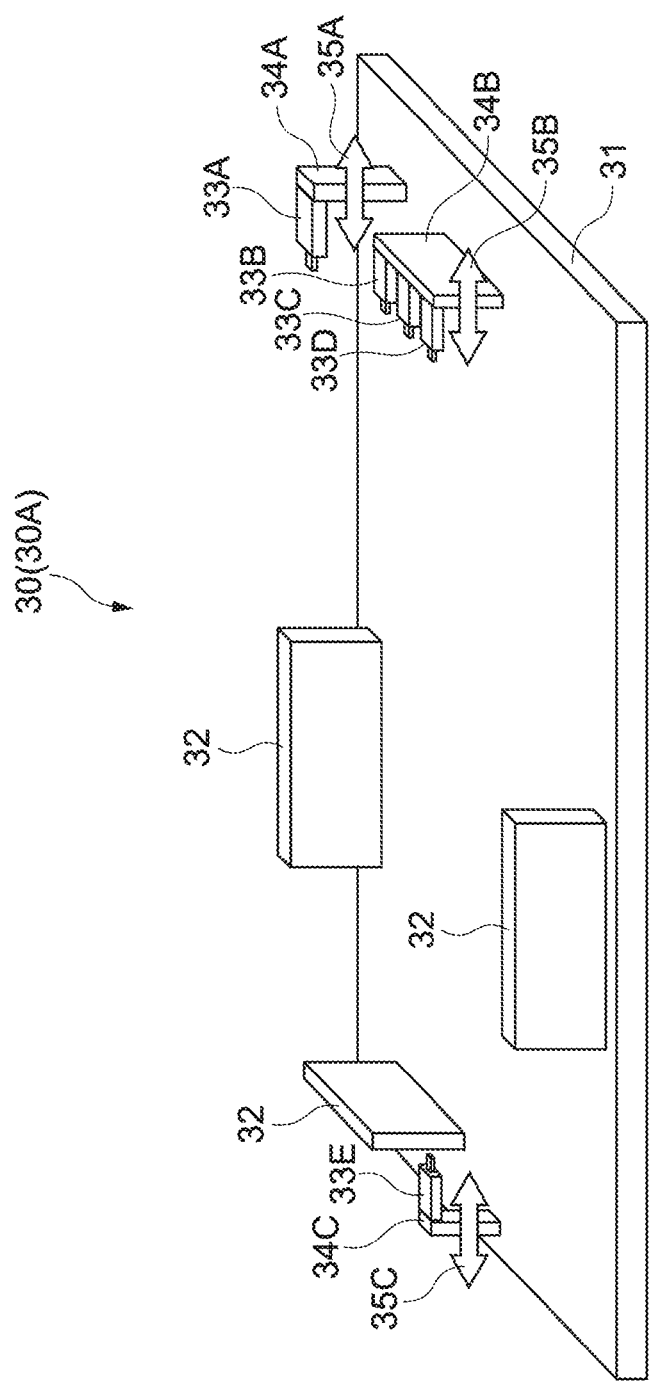
FIG. 8 A schematic perspective view of a disc drive inspection table.
Figure 9:
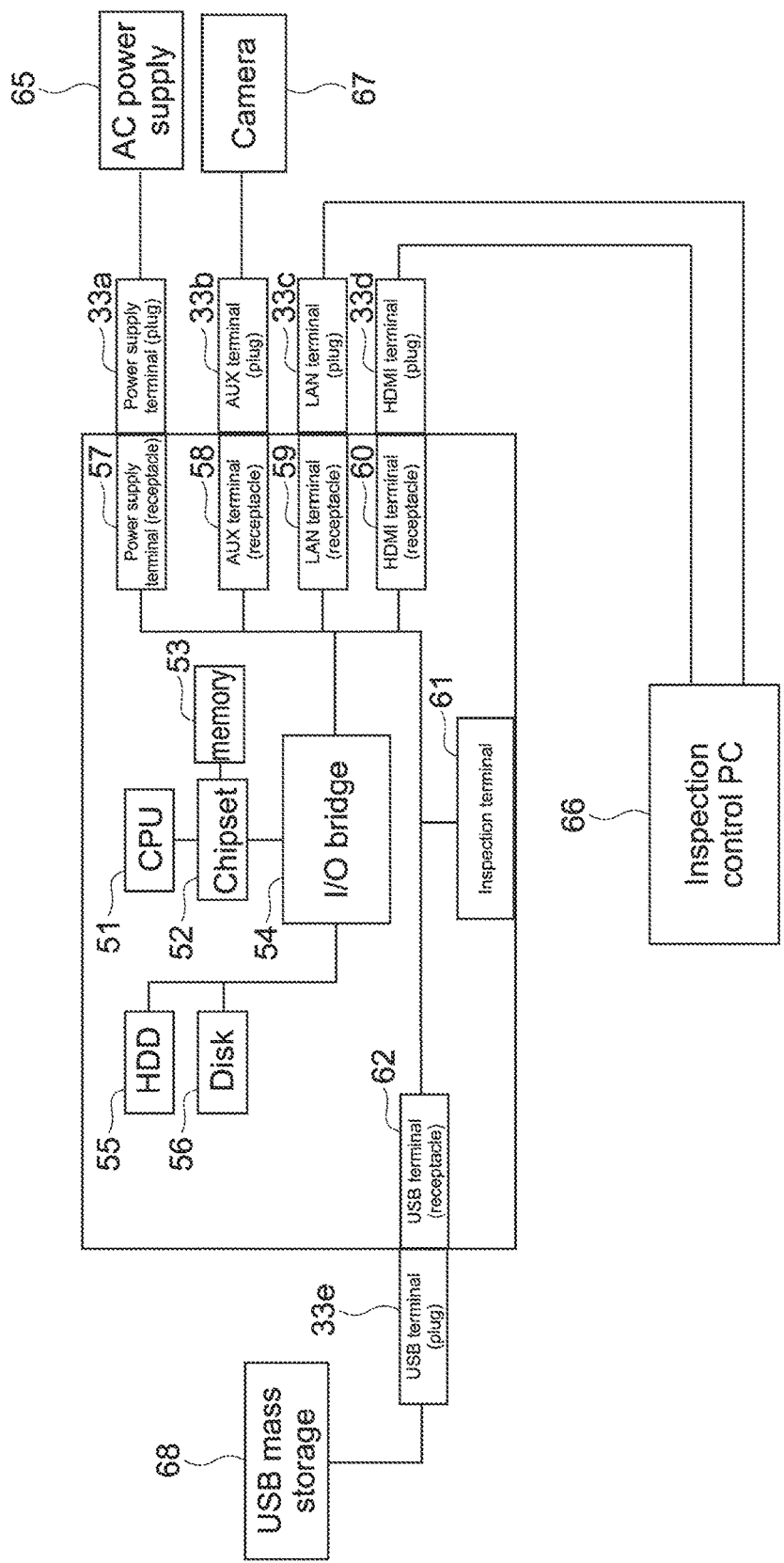
FIG. 9 An electrical block diagram showing a state where a work is mounted on the disc drive inspection table.

FIG. 8 is a schematic perspective view of the disc drive inspection table 30A. FIG. 9 is an electrical block diagram showing a state where the work 1 is mounted on the disc drive inspection table 30A.

The disc drive inspection table 30A includes a table 31, 3 wall portions 32 erected on the table 31, a power supply plug 33A, a LAN plug 33B, an AUX plug 33C, an HDMI plug 33D, and a USB plug 33E. The disc drive inspection table 30A also includes a first holding body 34A that holds the power supply plug 33A, a second holding body 34B that holds the LAN plug 33B, the AUX plug 33C, and the HDMI plug 33D, and a third holding body 34C that holds the USB plug 33E.

The disc drive inspection table 30A also includes a first horizontal movement mechanism 35A that moves the first holding body 34A in a longitudinal direction of the table, a second horizontal movement mechanism 35B that moves the second holding body 34B in the longitudinal direction of the table, and a third horizontal movement mechanism 35C that moves the third holding body 34C in the longitudinal direction of the table.

The table 31 is a rectangular plate-like member that has a size in which the work 1 can be mounted. Positions of the 3 wall portions 32 provided on the table 31 are set so that the work 1 can be mounted at an appropriate position on the table 31. Of the 3 wall portions 32, 2 wall portions 32 facing each other may be configured to be movable in a direction in which they are brought close to and set apart from each other.

The power supply plug 33A includes a plug-side power supply terminal 33a that is connected to the receptacle-side power supply terminal 57 mounted on the work 1 and is connected to the AC power supply 65. The AUX plug 33B includes a plug-side AUX terminal 33b that is connected to the receptacle-side AUX terminal 58 mounted on the work 1 and is connected to a camera 67.

Further, the LAN plug 33C includes a plug-side LAN terminal 33c that is connected to the receptacle-side LAN terminal 59 mounted on the work 1 and is connected to the inspection control PC 66. Similarly, the HDMI plug 33D includes a plug-side HDMI terminal 33d that is connected to the receptacle-side HDMI terminal 60 mounted on the work 1 and is connected to the inspection control PC 66.

The USB plug 33E includes a plug-side USB terminal 33e that is connected to the receptacle-side USB terminal 62 mounted on the work 1 and is connected to a USB mass storage device 68. The USB plug 33E is a USB plug conforming to a USB 3.0 standard. It should be noted that the USB mass storage device 68 stores an inspection program for the disc drive 56.

The first horizontal movement mechanism 35A moves the first holding body 34A holding the power supply plug 33A in the longitudinal direction of the table 31 to move the power supply plug 33A between a standby position and a connection position. Further, the second horizontal movement mechanism 35B moves the second holding body 34B holding the AUX plug 33B, the LAN plug 33C, and the HDMI plug 33D in the longitudinal direction of the table 31 to move the AUX plug 33B, the LAN plug 33C, and the HDMI plug 33D between a standby position and a connection position. Similarly, the third horizontal movement mechanism 35C moves the third holding body 34C holding the USB plug 33E in the longitudinal direction of the table 31 to move the USB plug 33E between a standby position and a connection position.

Figure 10:
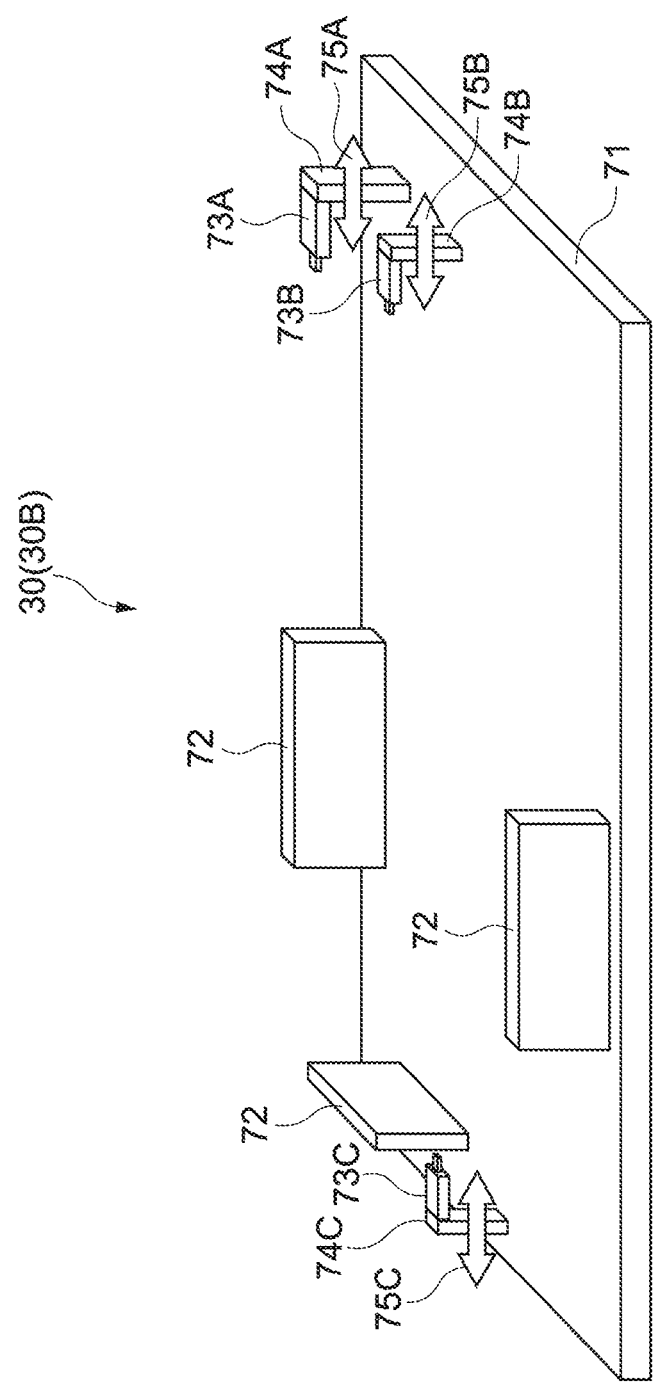
FIG. 10 A schematic perspective view of an HDD aging inspection table.
Figure 11:
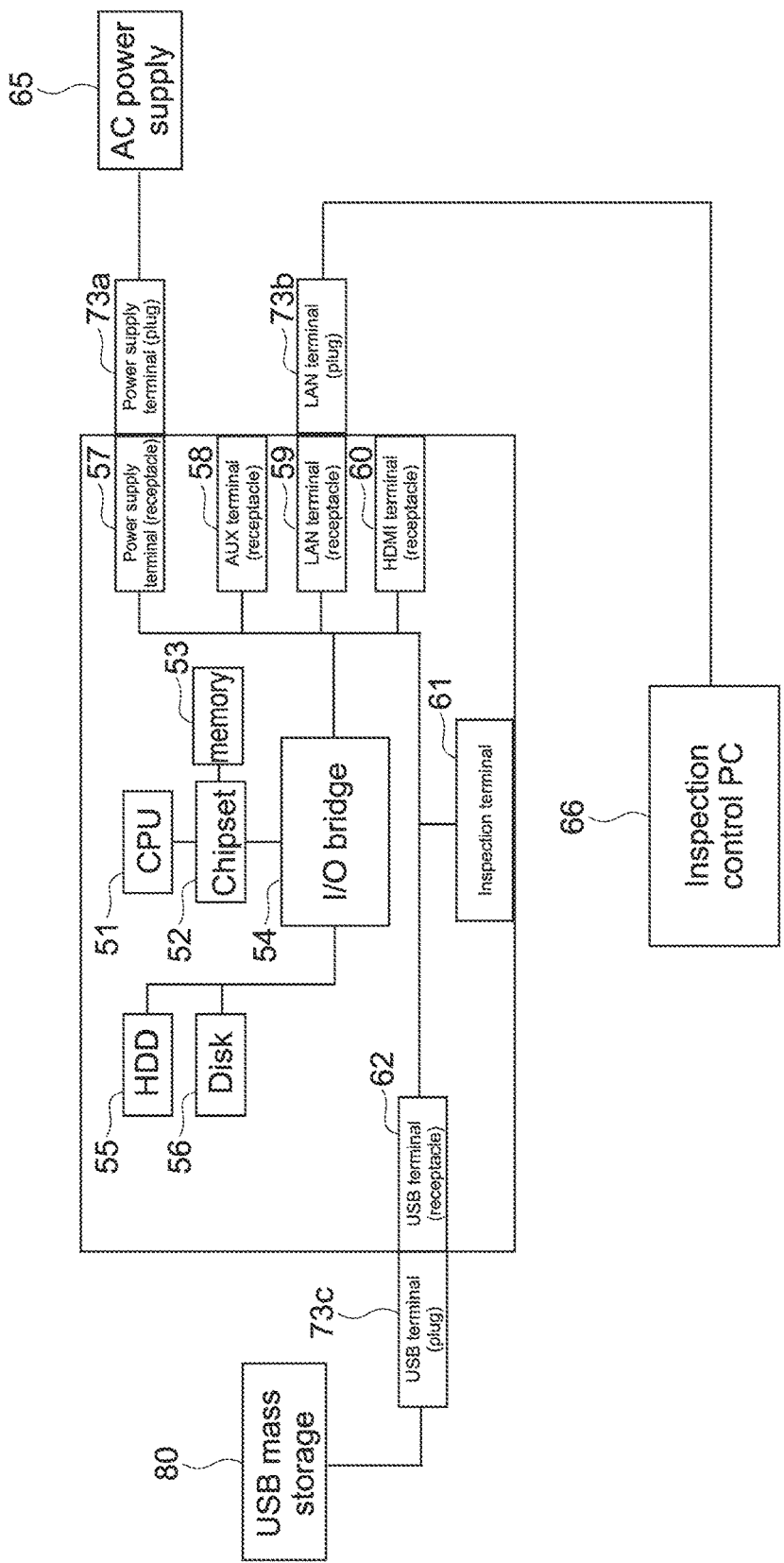
FIG. 11 An electrical block diagram showing a state where a work is mounted on the HDD aging inspection table.

FIG. 10 is a schematic perspective view of the HDD aging inspection table 30B. FIG. 11 is an electrical block diagram showing a state where the work 1 is mounted on the HDD aging inspection table 30B.

The HDD aging inspection table 30B includes a table 71, 3 wall portions 72 erected on the table 71, a power supply plug 73A, a LAN plug 73B, and a USB plug 73C. The HDD aging inspection table 30B also includes a first holding body 74A that holds the power supply plug 73A, a second holding body 74B that holds the LAN plug 73B, and a third holding body 74C that holds the USB plug 73B.

The HDD aging inspection table 30B also includes a first horizontal movement mechanism 75A that moves the first holding body 74A in a longitudinal direction of the table 71, a second horizontal movement mechanism 75B that moves the second holding body 74B in the longitudinal direction of the table 71, and a third horizontal movement mechanism 75C that moves the third holding body 74C in the longitudinal direction of the table 71.

The table 71 is a rectangular plate-like member that has a size in which the work 1 can be mounted. Positions of the 3 wall portions 72 provided on the table 71 are set so that the work 1 can be mounted at an appropriate position on the table 71. Of the 3 wall portions 72, 2 wall portions 72 facing each other may be configured to be movable in a direction in which they are brought close to and set apart from each other.

The power supply plug 73A includes a plug-side power supply terminal 73a that is connected to the receptacle-side power supply terminal 57 mounted on the work 1 and is connected to the AC power supply 65. The LAN plug 73B includes a plug-side LAN terminal 73b that is connected to the receptacle-side LAN terminal 59 mounted on the work 1 and is connected to the inspection control PC 66.

The USB plug 73C includes a plug-side USB terminal 73c that is connected to the USB terminal 62 mounted on the work 1 and is connected to a USB mass storage device 80. The USB plug 73C is a USB plug conforming to a USB 2.0 standard. It should be noted that the USB mass storage device 80 stores an aging inspection program for the HDD 55.

The first horizontal movement mechanism 75A moves the first holding body 74A holding the power supply plug 73A in the longitudinal direction of the table 71 to move the power supply plug 73A between a standby position and a connection position. Further, the second horizontal movement mechanism 75B moves the second holding body 74B holding the LAN plug 73B in the longitudinal direction of the table 71 to move the LAN plug 73B between a standby position and a connection position. Similarly, the third horizontal movement mechanism 75C moves the third holding body 74C holding the USB plug 73C in the longitudinal direction of the table 71 to move the USB plug 73C between a standby position and a connection position.

Figure 12:
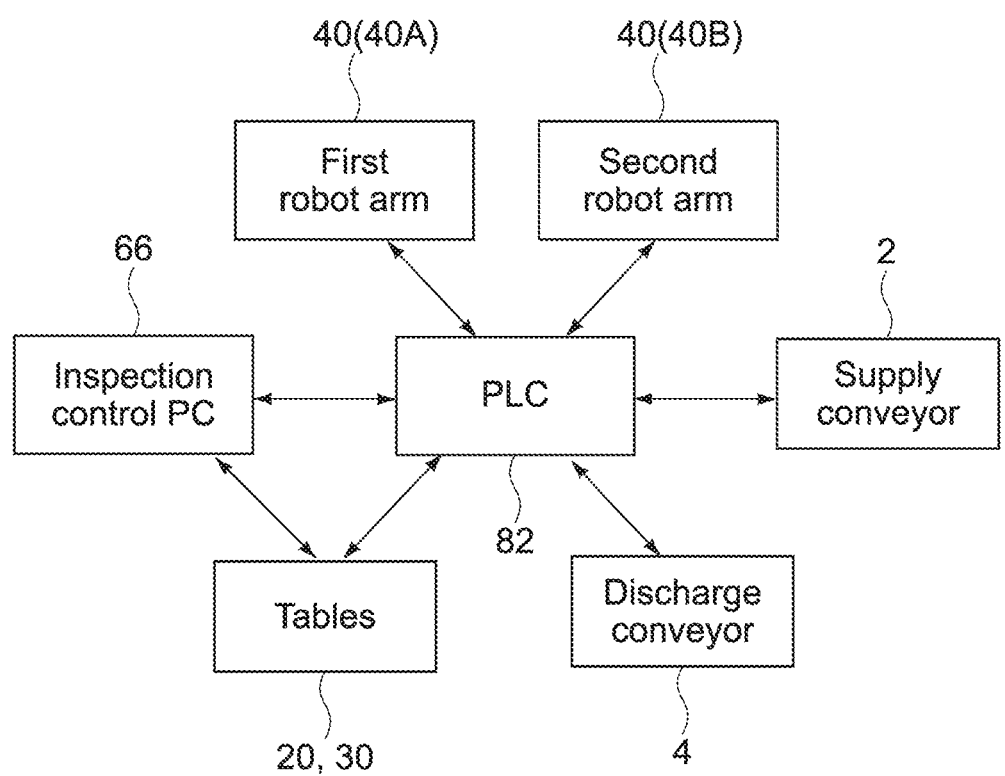
FIG. 12 A block diagram showing an electrical configuration of the production processing apparatus.

FIG. 12 is a block diagram showing an electrical configuration of the production processing apparatus 100. As shown in FIG. 12, the production processing apparatus 100 of this embodiment includes, in addition to the supply conveyor 2, the discharge conveyor 4, the first robot arm 40A, the second robot arm 40B, the tables 20 and 30, and the inspection control PC 66 described above, a PLC 82 (Programmable logic controller) that collectively controls the respective units of the production processing apparatus 100.

The PLC 82 includes at least a control unit (e.g., CPU), a storage unit, and a communication unit. The storage unit includes a volatile memory (e.g., RAM) that is used as a working area of the control unit and a nonvolatile memory (e.g., ROM) that fixedly stores various programs.

<Explanation of Operations>
[Basic Operation]

Figure 13:
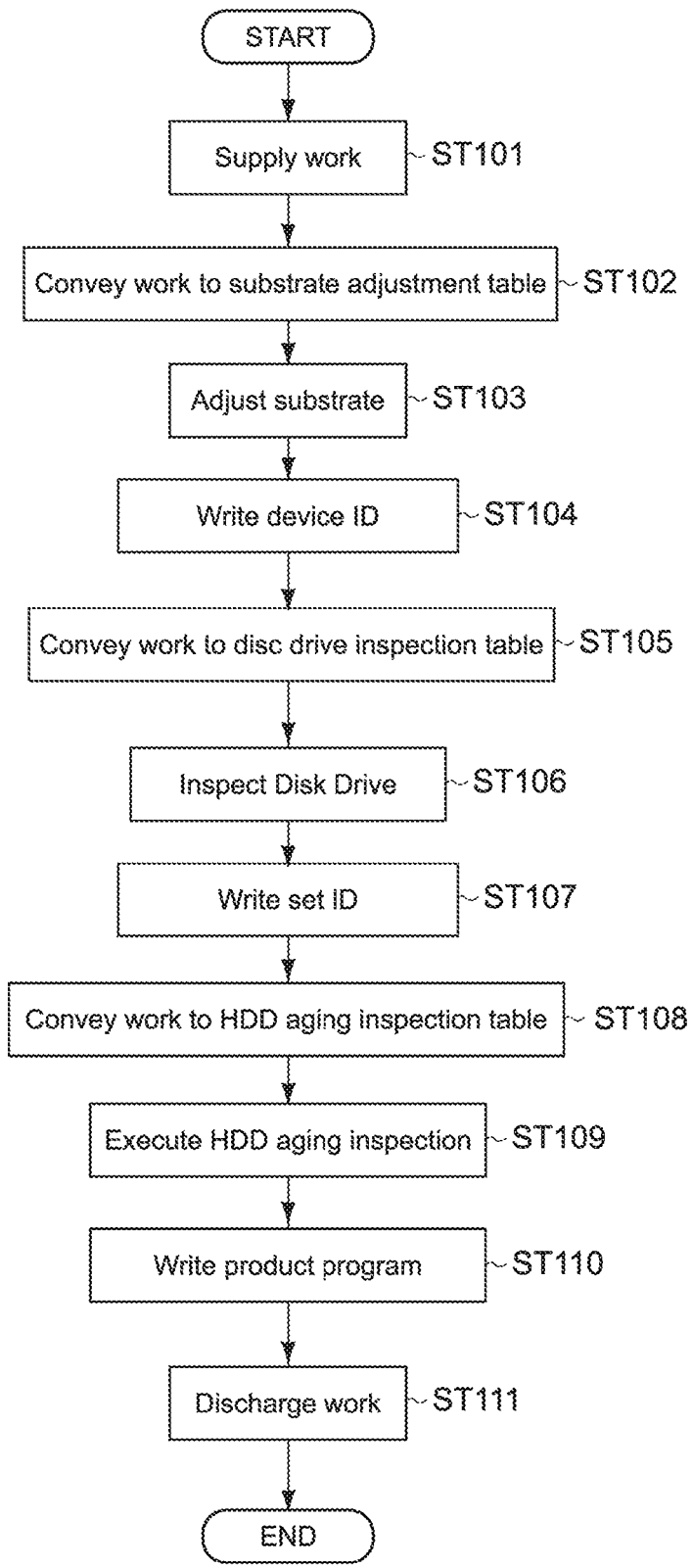
FIG. 13 A flowchart showing a basic operation of production processing in the production processing apparatus.

Next, operations of the production processing apparatus 100 will be described. First, a basic operation of the production processing carried out by the production processing apparatus 100 will be described. FIG. 13 is a diagram for explaining this operation.

First, the PLC 82 (control unit of PLC 82) controls the supply conveyor 2 to intermittently convey the work 1 placed on the supply conveyor 2 and move the work 1 to the supply area 3 set at the one end side of the supply conveyor 2 (Step 101).

Next, the PLC 82 controls the robot arm 40 to convey the work 1 on the supply area 3 to the substrate adjustment table 20 and places the work 1 on the substrate adjustment table 20 (Step 102).

Next, the PLC 82 controls the vertical movement mechanism 29 to move the pin jig 27 of the substrate adjustment table 20 from the standby position to the connection position (move it upwardly). Accordingly, the inspection terminal 61 is connected to the pins 28 of the pin jig 27.

Also at this time, the PLC 82 controls the first horizontal movement mechanism 26A and second horizontal movement mechanism 26B of the substrate adjustment table 20 to move the power supply plug 24A and the LAN plug 24B from the standby position to the connection position. Accordingly, the power supply terminals 57 and 25a are connected to each other, and also the LAN terminals 59 and 25b are connected to each other.

Subsequently, processing of adjusting a substrate mounted on the work 1 is executed (Step S103). In the substrate adjustment processing, the inspection control PC 66 first performs serial communication with the work 1 via the connection between the inspection terminal 61 and the pin jig 27 and executes a system software writing task on the work 1. The inspection control PC 66 also executes inspection program writing processing on the work 1 via the connection between the LAN terminals 59 and 25b. Upon ending the writing of an inspection program in the work 1, the CPU 51 and the main memory 53 are tested.

Upon ending the substrate adjustment processing, the inspection control PC 66 next executes device ID writing processing on the various devices mounted on the work 1 (Step 104).

Upon ending the device ID writing processing, the PLC 82 next controls the vertical movement mechanism 29 to move the pin jig 27 of the substrate adjustment table 20 from the connection position to the standby position (move it downwardly). Accordingly, the connection between the inspection terminal 61 and the pins 28 of the pin jig 27 is released.

Also at this time, the PLC 82 controls the first horizontal movement mechanism 26A and second horizontal movement mechanism 26B of the substrate adjustment table 20 to move the power supply plug 24A and the LAN plug 24B from the connection position to the standby position. Accordingly, the connection between the power supply terminals 57 and 25a and the connection between the LAN terminals 59 and 25b are released.

Next, the PLC 82 controls the robot arm 40 to move the work 1 on the substrate adjustment table 20 to the disc drive inspection table 30A and place the work 1 on the disc drive inspection table 30A (Step 105).

Next, the PLC 82 controls the first horizontal movement mechanism 35A, second horizontal movement mechanism 35B, and third horizontal movement mechanism 35C of the disc drive inspection table 30A to move the power supply plug 33A, the AUX plug 33B, the LAN plug 33C, the HDMI plug 33D, and the USB plug 33E from the standby position to the connection position. Accordingly, the power supply terminals 57 and 33a, the AUX terminals 58 and 33b, the LAN terminals 59 and 33c, the HDMI terminals 60 and 33d, and the USB terminals 62 and 33e are connected to each other.

As the USB terminals 62 and 33e are connected to each other, the inspection program of the disc drive 56 stored in the USB mass storage device 68 is read out by the work 1 to be executed in the work 1 (Step 106).

Further, as the LAN terminals 59 and 33c are connected, the inspection control PC 66 executes processing of writing an OPID, a set ID (ID unique to work 1), individual information of the work 1, and the like on the work 1 via the connection between the LAN terminals 59 and 33c (Step 107). Further, as the AUX terminals 58 and 33b, the LAN terminals 59 and 33c, the HDMI terminals 60 and 33d, and the USB terminals 62 and 33e are connected, the inspection control PC 66 executes an inspection regarding an input/output of interfaces thereof.

Upon ending the processing on the disc drive inspection tables 30A, the PLC 82 controls the first horizontal movement mechanism 35A, second horizontal movement mechanism 35B, and third horizontal movement mechanism 35C of the disc drive inspection table 30A to move the power supply plug 33A, the AUX plug 33B, the LAN plug 33C, the HDMI plug 33D, and the USB plug 33E from the connection position to the standby position. Accordingly, the connections between the power supply terminals 57 and 33a, the AUX terminals 58 and 33b, the LAN terminals 59 and 33c, the HDMI terminals 60 and 33d, and the USB terminals 62 and 33e are released.

Next, the PLC 82 controls the robot arm 40 to move the work 1 on the disc drive inspection table 30A to the HDD aging inspection table 30B and place the work 1 on the HDD aging inspection table 30B (Step 108).

Next, the PLC 82 controls the first horizontal movement mechanism 75A, second horizontal movement mechanism 75B, and third horizontal movement mechanism 75C of the HDD aging inspection table 30B to move the power supply plug 73A, the LAN plug 73B, and the USB plug 73C from the standby position to the connection position. Accordingly, the power supply terminals 57 and 73a, the LAN terminals 59 and 73b, and the USB terminals 62 and 73c are connected to each other.

As the USB terminals 62 and 73c are connected to each other, an aging inspection program of the HDD 55 stored in the USB mass storage device 80 is read out by the work 1. Then, the inspection control PC 66 executes an aging inspection of the HDD 55 via the connection between the LAN terminals 59 and 73b (Step 109). The inspection control PC 66 also executes processing of writing a product program on the work 1 (shipment stage) via the connection between the LAN terminals 59 and 73b (Step 110).

Upon ending the processing on the HDD aging inspection table 30B, the PLC 82 controls the first horizontal movement mechanism 75A, the second horizontal movement mechanism 75B, and the third horizontal movement mechanism 75C to move 73A, the LAN plug 73B, and the USB plug 73C from the connection position to the standby position. Accordingly, the connections between the power supply terminals 57 and 73a, the LAN terminals 59 and 73b, and the USB terminals 62 and 73c are released.

Next, the PLC 82 controls the robot arm 40 to convey the work 1 on the HDD aging inspection table 30B to the discharge area 5 of the discharge conveyor 4 and place the work 1 in the discharge area 5. Then, the PLC 82 controls the discharge conveyor 4 to intermittently convey the work 1 placed on the discharge conveyor 4 and guide the work 1 to the discharge port (Step 111). It should be noted that the work 1 determined as defective by the inspection is guided to the defective-item discharge port by the discharge conveyor 4.

[Operation for Reducing Standby Time of Robot Arm 40]

Here, for example, it is assumed that one of the substrate adjustment tables 20 of the first production processing unit 10A is capable of accepting the work 1 and one of the substrate adjustment tables 20 of the second production processing unit 10B is also capable of accepting the work 1. At this time, it is assumed that the work 1 has been conveyed to the supply area 3 of the supply conveyor 2 by drive of the supply conveyor 2.

In such a case, a situation where the first robot arm 40A can take out the work 1 placed on the supply area and place it on the substrate adjustment table 20 and a situation where the second robot arm 40B can take out the work 1 placed on the supply area 3 and place it on the substrate adjustment table 20 are established at the same time.

Moreover, for example, it is assumed that the work 1 can be taken out of any of the HDD aging inspection tables 30B of the first production processing unit 10A and the work 1 can also be taken out of any of the HDD aging inspection tables 30B of the second production processing unit 10B. At this time, it is assumed that the discharge area 5 of the discharge conveyor 4 has become capable of accepting the work 1 by the drive of the discharge conveyor 4.

In this case, a situation where the first robot arm 40A can take out the work 1 from the HDD aging inspection table 30B and place it on the discharge area 5 and a situation where the second robot arm 40B can take out the work 1 from the HDD aging inspection table 30B and place it on the discharge area 5 are established at the same time.

In these cases, if the work 1 is conveyed by one of the two robot arms 40 and the other robot arm 40 is put to a standby state, a standby time occurs in the other robot to eventually lower production efficiency.

In this regard, the production processing apparatus 100 of this embodiment executes processing for reducing such a standby time. Hereinafter, this processing will be described.

FIG. 14 is a diagram showing an example of conveyance patterns stored in the storage unit of the PLC 82. On the upper side of FIG. 14, first conveyance patterns each as a conveyance pattern of the first robot arm 40A are shown. On the other hand, on the lower side of FIG. 14, second conveyance patterns each as a conveyance pattern of the second robot arm 40B are shown.

As shown in FIG. 14, the conveyance patterns each include a conveyance source number and a conveyance destination number. In this embodiment, as the conveyance source number and the conveyance destination number, Numbers 1 to 8 are allocated to the 8 substrate adjustment tables 20 of the first production processing unit 10A, and Numbers 9 and 10 are allocated to the 2 disc drive inspection tables 30A. In addition, Numbers 11 to 16 are allocated to the 6 HDD aging inspection tables 30B.

Similarly, as the conveyance source number and the conveyance destination number, Numbers 101 to 108 are allocated to the 8 substrate adjustment tables 20 of the second production processing unit 10B, and Numbers 109 and 110 are allocated to the 2 disc drive inspection tables 30A. In addition, Numbers 111 to 116 are allocated to the 6 HDD aging inspection tables 30B.

It should be noted that Number 17 is allocated to the supply area 3 of the supply conveyor 2, and Number 18 is allocated to the discharge area 5 of the discharge conveyor 4.

Every time the conveyance condition of the work 1 is satisfied, the PLC 82 executes processing of stocking the established conveyance patterns in the storage unit of the PLC 82 from the top. It should be noted that as shown in FIG. 14, the PLC 82 separately stores the first conveyance pattern and the second conveyance pattern.

In the example shown on the upper side of FIG. 14, a state where 3 conveyance patterns are stocked as the first conveyance pattern is shown. Of the 3 conveyance patterns, the conveyance pattern at the top is a conveyance pattern in which the substrate adjustment table 20 corresponding to Number 3 is the conveyance source and the disc drive inspection table 30A corresponding to Number 9 is the conveyance destination. In addition, the second conveyance pattern from the top is a conveyance pattern in which the supply area 3 corresponding to Number 17 is the conveyance source and the substrate adjustment table 20 corresponding to Number 1 is the conveyance destination, and the third conveyance pattern from the top is a conveyance pattern in which the disc drive inspection table 30A corresponding to Number 10 is the conveyance source and the HDD aging inspection table 30B corresponding to Number 13 is the conveyance destination.

Further, in the example shown on the lower side of FIG. 14, a state where 2 conveyance patterns are stocked as the second conveyance pattern is shown. Of the 2 conveyance patterns, the conveyance pattern at the top is a conveyance pattern in which the substrate adjustment table 20 corresponding to Number 108 is the conveyance source and the disc drive inspection table 30A corresponding to Number 109 is the conveyance destination. In addition, the second conveyance pattern from the top is a conveyance pattern in which the HDD aging inspection table 30B corresponding to Number 116 is the conveyance source and the discharge area 5 corresponding to Number 18 is the conveyance destination.

Here, a case where the conveyance condition of the work 1 is satisfied will be described.

(1) A state where the work 1 is present in the supply area 3 and the substrate adjustment table 20 is capable of accepting the work 1. It should be noted that the state where the substrate adjustment table 20 is capable of accepting the work 1 is a state where the work 1 is not placed on the substrate adjustment table 20 and the power supply plug 24A, the LAN plug 24B, and the pin jig 27 are at the standby positions.

(2) A state where the work 1 can be taken out of the substrate adjustment table 20 and the disc drive inspection table 30A is capable of accepting the work 1. It should be noted that the state where the work 1 can be taken out of the substrate adjustment table 20 is a state where the work 1 is placed on the substrate adjustment table 20, processing with respect to the work 1 is ended, and the power supply plug 24A, the LAN plug 24B, and the pin jig 27 are at the standby positions. In addition, the state where the disc drive inspection table 30A is capable of accepting the work 1 is a state where the work 1 is not placed on the substrate adjustment table 20 and the power supply plug 33A, the AUX plug 33B, the LAN plug 33C, the HDMI plug 33D, and the USB plug 33E are at the standby positions.

(3) A state where the work 1 can be taken out of the disc drive inspection table 30A and the HDD aging inspection table 30B is capable of accepting the work 1. It should be noted that the state where the work 1 can be taken out of the disc drive inspection table 30A is a state where the work 1 is placed on the disc drive inspection table 30A, processing with respect to the work 1 is ended, and the power supply plug 33A, the AUX plug 33B, the LAN plug 33C, the HDMI plug 33D, and the USB plug 33E are at the standby positions. In addition, the state where the HDD aging inspection table 30B is capable of accepting the work 1 is a state where the work 1 is not placed on the HDD aging inspection table 30B and the power supply plug 73A, the LAN plug 73B, and the USB plug 73C are at the standby positions.

(4) A state where the work 1 can be taken out of the HDD aging inspection table 30B and the work 1 is not present in the discharge area 5 of the discharge conveyor 4. It should be noted that the state where the work 1 can be taken out of the HDD aging inspection table 30B is a state where the work 1 is placed on the HDD aging inspection table 30B, processing with respect to the work 1 is ended, and the power supply plug 73A, the LAN plug 73B, and the USB plug 73C are at the standby positions.

It should be noted that when there are a plurality of tables 20 and 30 that may become a conveyance destination in the same production processing unit 10, any one of the tables is selected as the conveyance destination. To give a specific explanation using an example, when the work 1 is present in the supply area 3 and there are a plurality of substrate adjustment tables 20 capable of accepting the work 1 in the same first production processing unit 10 regarding (1) above, any one of the substrate adjustment tables 20 is selected as the conveyance destination.

Moreover, when there are a plurality of tables that may become a conveyance source in the same production processing unit 10, any one of the tables is selected as the conveyance source. To give a specific explanation using an example, when the work 1 is not present in the discharge area 5 of the discharge conveyor 4 and there are a plurality of HDD aging inspection tables 30B from which the works 1 can be taken out in the same first production processing unit 10 regarding (4) above, any one of the HDD aging inspection tables 30B is selected as the conveyance source.

Here, regarding (1) above, a case where the work 1 is present in the supply area 3 and the substrate adjustment tables 20 capable of accepting the work 1 exist in different production processing units 10 will be discussed. In this case, a first conveyance pattern in which the supply area 3 becomes the conveyance source and the substrate adjustment table 20 of the first production processing unit 10A becomes the conveyance destination is stored in the storage unit of the PLC 82. In addition, a second conveyance pattern in which the supply area 3 becomes the conveyance source and the substrate adjustment table 20 of the second production processing unit 10B becomes the conveyance destination is stored in the storage unit of the PLC 82.

Moreover, regarding (4) above, a case where the work 1 is not present in the discharge area 5 of the discharge conveyor 4 and the HDD aging inspection tables 30B from which the works 1 can be taken out exist in different production processing units 10 will be discussed. In this case, a first conveyance pattern in which the HDD aging inspection table 30B of the first production processing unit 10A becomes the conveyance source and the discharge area 5 becomes the conveyance destination is stored in the storage unit of the PLC 82. In addition, a second conveyance pattern in which the HDD aging inspection table 30B of the second production processing unit 10B becomes the conveyance source and the discharge area 5 becomes the conveyance destination is stored in the storage unit of the PLC 82.

Figure 15:
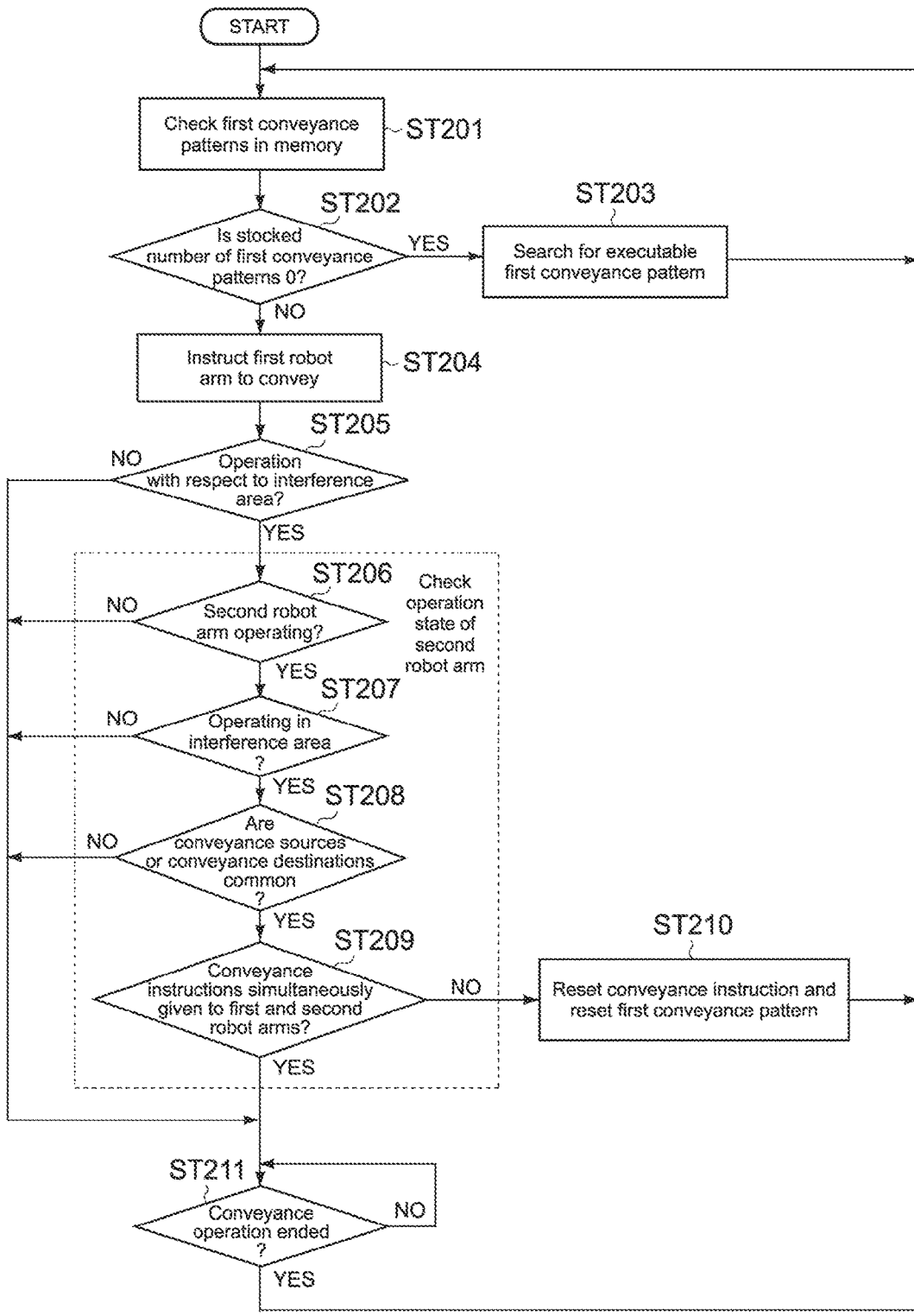
FIG. 15 A flowchart showing processing carried out when a PLC controls a first robot arm to convey a work.
Figure 16:
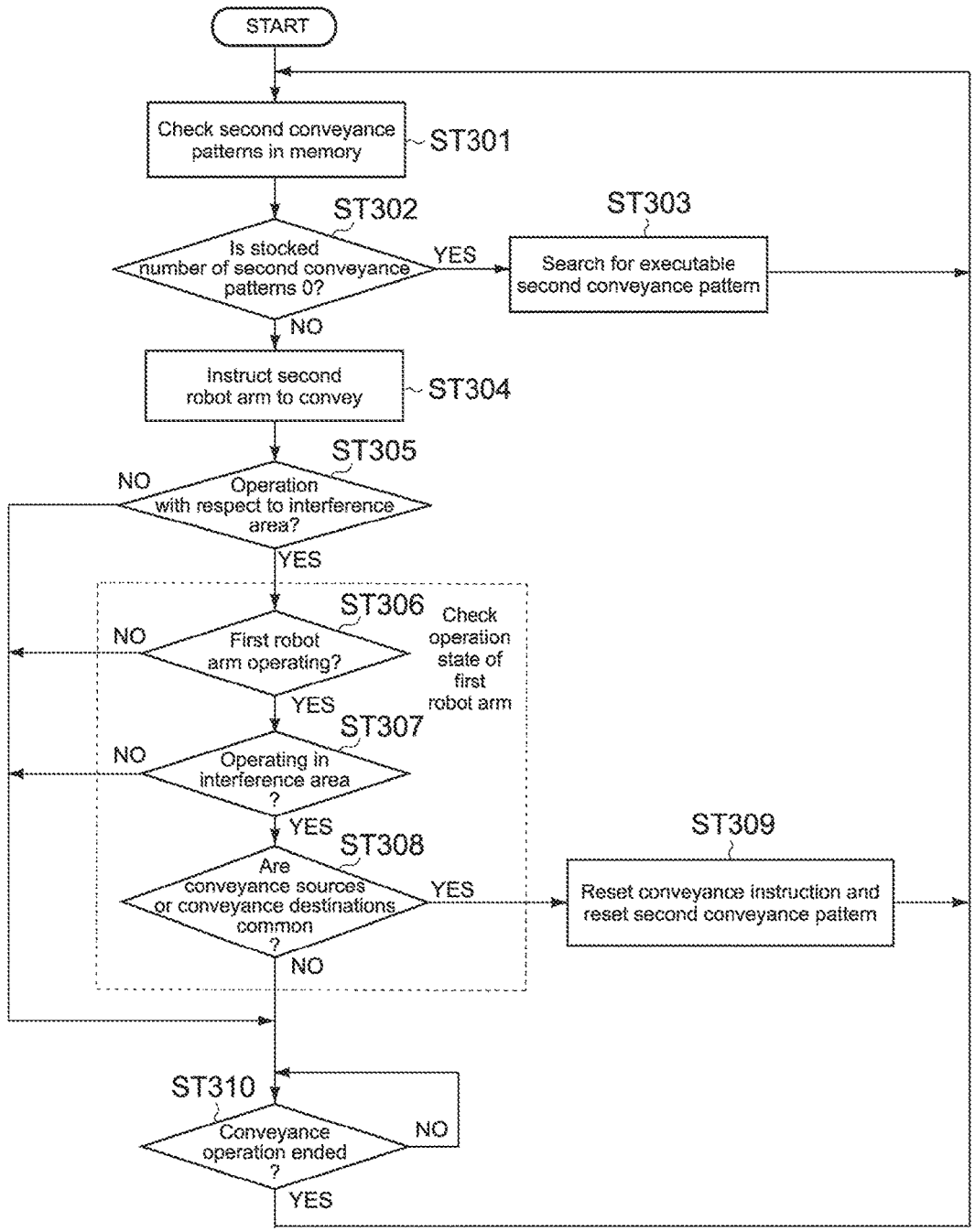
FIG. 16 A flowchart showing processing carried out when the PLC controls a second robot arm to convey a work.

Next, an operation carried out by the PLC 82 when controlling the robot arms 40 will be described. FIG. 15 is a flowchart showing processing carried out when the PLC 82 controls the first robot arm 40A to convey the work 1. FIG. 16 is a flowchart showing processing carried out when the PLC 82 controls the second robot arm 40B to convey the work 1.

First, with reference to FIG. 15, the processing carried out when the PLC 82 controls the first robot arm 40A to convey the work 1 will be described.

As shown in FIG. 15, the PLC 82 (control unit of PLC 82) first checks the first conveyance patterns (see upper side of FIG. 14) stored in the storage unit of the PLC 82 (Step 201). Next, the PLC 82 judges whether the stocked number of first conveyance patterns is 0 (Step 202).

When the stocked number of first conveyance patterns is 0 (YES in Step 202), the PLC 82 executes processing of searching for a currently-executable first conveyance pattern (Step 203). Specifically, the PLC 82 executes processing of searching whether there is a first conveyance pattern that satisfies the conveyance conditions (1) to (4) above. By the processing as described above, it becomes possible to prevent the currently-executable first conveyance pattern from being overlooked.

Upon executing the processing of searching for the first conveyance pattern, the PLC 82 returns to Step 201 and checks the first conveyance patterns stored in the storage unit of the PLC 82.

When the first conveyance pattern is stocked in the storage unit of the PLC 82 in Step 202 (NO in Step 202), the PLC 82 reads the first conveyance pattern at the top from the storage unit. Then, the PLC 82 instructs the first robot arm 40A to convey by that first conveyance pattern and causes the first robot arm 40A to start the conveyance operation (Step 204).

Next, the PLC 82 judges whether the conveyance operation of the first robot arm 40A is an operation with respect to an interference area (Step 205). Here, the interference area in this embodiment refers to both the supply area 3 and the discharge area 5.

Specifically, in Step 205, the PLC 82 judges whether the first conveyance pattern currently being executed by the first robot arm 40A includes one of Number 17 corresponding to the supply area 3 and Number 18 corresponding to the discharge area 5, to judge whether the conveyance operation of the first robot arm 40A is an operation with respect to the interference area.

When the conveyance operation of the first robot arm 40A is not an operation with respect to the interference area (NO in Step 205), the PLC 82 advances to Step 211 and judges whether the conveyance operation of the first robot arm 40A has ended. When the conveyance operation has ended (YES in Step 211), the PLC 82 deletes the ended first conveyance pattern from the storage unit and returns to Step 201 again.

When judged in Step 205 that the conveyance operation of the first robot arm 40A is an operation with respect to the interference area (YES in Step 205), the PLC 82 advances to subsequent Steps 206 to 209 and executes processing of checking an operation state of the second robot arm 40B.

In Step 206, the PLC 82 judges whether the second robot arm 40B is being operated. When the second robot arm 40B is not being operated (NO in Step 206), the PLC 82 advances to Step 211 and judges whether the conveyance operation of the first robot arm 40A has ended.

On the other hand, when the second robot arm 40B is being operated (YES in Step 206), whether the second robot arm 40B is operating in the interference area is judged (Step 207). Specifically, in Step 207, the PLC 82 judges whether the second conveyance pattern currently being executed by the second robot arm 40B includes one of Number 17 corresponding to the supply area 3 and Number 18 corresponding to the discharge area 5, to judge whether the second robot arm 40B is operating in the interference area.

When the second robot arm 40B is not operating in the interference area (NO in Step 207), the PLC 82 advances to Step 211 and judges whether the conveyance operation of the first robot arm 40A has ended.

On the other hand, when the second robot arm 40B is operating in the interference area (YES in Step 207), the PLC 82 judges whether the supply area 3 (Number 17) is commonly set as the conveyance source of the first robot arm 40A (first conveyance pattern) and the conveyance source of the second robot arm 40B (second conveyance pattern). The PLC 82 also judges whether the discharge area 5 (Number 18) is commonly set as the conveyance destination of the first robot arm 40A (first conveyance pattern) and the conveyance destination of the second robot arm 40B (second conveyance pattern) (Step 208).

Specifically, in Step 208, the PLC 82 judges whether an interference has occurred in the first robot arm 40A and the second robot arm 40B (first conveyance pattern and second conveyance pattern). It should be noted that in this embodiment, a state where the conveyance sources or the conveyance destinations are the same for the first robot arm 40A and the second robot arm 40B (first conveyance pattern and second conveyance pattern) is referred to as "interference".

When an interference has not occurred (NO in Step 208), the PLC 82 advances to Step 211 and judges whether the conveyance operation of the first robot arm 40A has ended.

On the other hand, when an interference has occurred (YES in Step 208), the PLC 82 judges whether the conveyance instructions have been transmitted at the same time to the first robot arm 40A and the second robot arm 40B (see Step 304 of FIG. 16).

When the conveyance instructions have been transmitted at the same time to the first robot arm 40A and the second robot arm 40B (YES in Step 209), the PLC 82 continues the conveyance operation by the first robot arm 40A as it is. Then, the PLC 82 advances to Step 211 and judges whether the conveyance operation of the first robot arm 40A has ended.

Specifically, when an interference has occurred in the first robot arm 40A and the second robot arm 40B (first conveyance pattern and second conveyance pattern) and the conveyance instructions have been transmitted at the same time to the first robot arm 40A and the second robot arm 40B, the PLC 82 preferentially executes the conveyance operation by the first robot arm 40A.

On the other hand, when the conveyance instructions have not been transmitted at the same time to the first robot arm 40A and the second robot arm 40B (NO in Step 209), that is, when the conveyance operation by the second robot arm 40B by the second conveyance pattern involving the interference is started before the first robot arm 40A, the PLC 82 advances to the next Step 210.

In Step 210, the PLC 82 resets the conveyance instruction by the first conveyance pattern involving the interference and interrupts the conveyance operation of the first robot arm 40A. The PLC 82 also deletes (resets) the first conveyance pattern involving the interference from the storage unit. Then, the PLC 82 returns to Step 201, checks the first conveyance patterns in the storage unit, and when there is a stock, transmits a conveyance instruction by the first conveyance pattern to the first robot arm 40A.

By the processing as described above, in this embodiment, when the conveyance operation involving the interference is started by the second robot arm 40B before the first robot arm 40A, the first robot arm 40A can start the next conveyance operation without waiting for the conveyance operation of the second robot arm 40B.

Next, with reference to FIG. 16, the processing carried out when the PLC 82 controls the second robot arm 40B to convey the work 1 will be described.

As shown in FIG. 16, the PLC 82 (control unit of PLC 82) first checks the second conveyance patterns (see lower side of FIG. 14) stored in the storage unit of the PLC 82 (Step 301). Next, the PLC 82 judges whether the stocked number of second conveyance patterns is 0 (Step 302).

When the stocked number of second conveyance patterns is 0 (YES in Step 302), the PLC 82 executes processing of searching for a currently-executable second conveyance pattern (Step 303). Specifically, the PLC 82 executes processing of searching whether there is a second conveyance pattern that satisfies the conveyance conditions (1) to (4) above. By the processing as described above, it becomes possible to prevent the currently-executable second conveyance pattern from being overlooked.

Upon executing the processing of searching for the second conveyance pattern, the PLC 82 returns to Step 201 and checks the second conveyance patterns stored in the storage unit of the PLC 82.

When the second conveyance pattern is stocked in the storage unit of the PLC 82 in Step 302 (NO in Step 302), the PLC 82 reads the second conveyance pattern at the top from the storage unit. Then, the PLC 82 instructs the second robot arm 40B to convey by that second conveyance pattern and causes the second robot arm 40B to start the conveyance operation (Step 304).

Next, the PLC 82 judges whether the conveyance operation of the second robot arm 40B is an operation with respect to an interference area (Step 305). Specifically, the PLC 82 judges whether the second conveyance pattern currently being executed by the second robot arm 40B includes one of Number 17 corresponding to the supply area 3 and Number 18 corresponding to the discharge area 5, to judge whether the conveyance operation of the second robot arm 40B is an operation with respect to the interference area.

When the conveyance operation of the second robot arm 40B is not an operation with respect to the interference area (NO in Step 305), the PLC 82 advances to Step 310 and judges whether the conveyance operation of the second robot arm 40B has ended. When the conveyance operation has ended (YES in Step 310), the PLC 82 deletes the ended second conveyance pattern from the storage unit and returns to Step 301 again.

On the other hand, when the conveyance operation of the second robot arm 40B is an operation with respect to the interference area (YES in Step 305), the PLC 82 advances to subsequent Steps 306 to 308 and executes processing of checking an operation state of the first robot arm 40A.

In Step 306, the PLC 82 judges whether the first robot arm 40A is being operated. When the first robot arm 40A is not being operated (NO in Step 306), the PLC 82 advances to Step 310 and judges whether the conveyance operation of the second robot arm 40B has ended.

On the other hand, when the first robot arm 40A is being operated (YES in Step 306), whether the first robot arm 40A is operating in the interference area is judged (Step 307). Specifically, in Step 307, the PLC 82 judges whether the first conveyance pattern currently being executed by the first robot arm 40A includes one of Number 17 corresponding to the supply area 3 and Number 18 corresponding to the discharge area 5, to judge whether the first robot arm 40A is operating in the interference area.

When the first robot arm 40A is not operating in the interference area (NO in Step 307), the PLC 82 advances to Step 310 and judges whether the conveyance operation of the second robot arm 40B has ended.

On the other hand, when the first robot arm 40A is operating in the interference area (YES in Step 307), the PLC 82 judges whether the supply area 3 (Number 17) is commonly set as the conveyance source of the first robot arm 40A (first conveyance pattern) and the conveyance source of the second robot arm 40B (second conveyance pattern). The PLC 82 also judges whether the discharge area 5 (Number 18) is commonly set as the conveyance destination of the first robot arm 40A (first conveyance pattern) and the conveyance destination of the second robot arm 40B (second conveyance pattern) (Step 308).

When an interference has not occurred (NO in Step 308), the PLC 82 advances to Step 310 and judges whether the conveyance operation of the second robot arm 40B has ended.

On the other hand, when an interference has occurred (YES in Step 308), the PLC 82 advances to the next Step 309. In Step 309, the PLC 82 resets the conveyance instruction by the second conveyance pattern involving the interference and interrupts the conveyance operation of the second robot arm 40B. The PLC 82 also deletes (resets) the second conveyance pattern involving the interference from the storage unit.

Then, the PLC 82 returns to Step 301, checks the second conveyance patterns in the storage unit, and when there is a stock, transmits a conveyance instruction by the second conveyance pattern to the second robot arm 40B.

By the processing as described above, in this embodiment, when the conveyance operation involving the interference is started by the first robot arm 40A, the second robot arm 40B can start the next conveyance operation without waiting for the conveyance operation of the first robot arm 40A.

Here, control of the first robot arm 40A and the second robot arm 40B by the PLC 82 will be described in further detail using specific examples.

[Case 1]

First, a case where conveyance instructions involving an interference are transmitted to the robot arms 40 at the same time will be described.

Here, as an example, the stocked number of first conveyance patterns and second conveyance patterns is assumed to be 0. Further, it is assumed that one of the substrate adjustment tables 20 of the first production processing unit 10A is capable of accepting the work 1 and one of the substrate adjustment tables 20 of the second production processing unit 10B is also capable of accepting the work 1. In addition, it is assumed that the work 1 has been conveyed to the supply area 3 of the supply conveyor 2 by drive of the supply conveyor 2.

In such a case, the first conveyance pattern in which the supply area 3 (Number 17) is the conveyance source is stocked in the storage unit of the PLC 82, and simultaneously, the second conveyance pattern in which the supply area 3 (Number 17) is the conveyance source is stocked in the storage unit of the PLC 82. In such a case, conveyance instructions involving an interference are transmitted to the first robot arm 40A and the second robot arm 40B at the same time (see Step 204 of FIG. 15 and Step 304 of FIG. 16).

Further, as another example, the stocked number of first conveyance patterns and second conveyance patterns is assumed to be 0. Further, it is assumed that the work 1 can be taken out from one of the HDD aging inspection tables 30B of the first production processing unit 10A and the work 1 can be taken out from one of the HDD aging inspection tables 30B of the second production processing unit 10B. In addition, it is assumed that the discharge area 5 of the discharge conveyor 4 is capable of accepting the work 1 by drive of the discharge conveyor 4.

In such a case, the first conveyance pattern in which the discharge area 5 (Number 18) is the conveyance destination is stocked in the storage unit of the PLC 82, and simultaneously, the second conveyance pattern in which the discharge area 5 (Number 18) is the conveyance destination is stocked in the storage unit of the PLC 82. Also in such a case, conveyance instructions involving an interference are transmitted to the first robot arm 40A and the second robot arm 40B at the same time.

In the case as described above, the conveyance operation of the first robot arm 40A is prioritized (Step 209 of FIG. 15). On the other hand, the conveyance operation of the second robot arm 40B is interrupted, and the second conveyance pattern involving an interference is deleted (reset) from the storage unit (Step 309 of FIG. 16). In addition, when there is a stock of second conveyance patterns, a conveyance instruction by the second conveyance pattern is transmitted to the second robot arm 40B.

By the processing as described above, in this embodiment, when the conveyance operation involving an interference is started by the first robot arm 40A, the second robot arm 40B can start the next conveyance operation without waiting for the conveyance operation of the first robot arm 40A.

[Case 2]

Next, a case where conveyance instructions involving an interference are transmitted to the robot arms 40 at different timings will be described.

Here, as an example, it is assumed that the stock of first conveyance patterns is 0 and the stock of second conveyance patterns is 1. It should be noted that the stocked second conveyance pattern does not include the supply area 3 (Number 17) and the discharge area 5 (Number 18). Moreover, it is assumed that one of the substrate adjustment tables 20 of the first production processing unit 10A is capable of accepting the work 1 and one of the substrate adjustment tables 20 of the second production processing unit 10B is also capable of accepting the work 1. In addition, it is assumed that the work 1 has been conveyed to the supply area 3 of the supply conveyor 2 by the drive of the supply conveyor 2.

In such a case, the first conveyance pattern in which the supply area 3 (Number 17) is the conveyance source is stocked at the top, and simultaneously, the second conveyance pattern in which the supply area 3 (Number 17) is the conveyance source is stocked second from the top. In such a case, conveyance instructions involving an interference are transmitted to the first robot arm 40A and the second robot arm 40B at different timings (see Step 204 of FIG. 15 and Step 304 of FIG. 16).

Further, as another example, it is assumed that the stock of first conveyance patterns is 0 and the stock of second conveyance patterns is 1. It should be noted that the stocked second conveyance pattern does not include the supply area 3 (Number 17) and the discharge area 5 (Number 18). Further, it is assumed that the work 1 can be taken out from one of the HDD aging inspection tables 30B of the first production processing unit 10A and the work 1 can be taken out from one of the HDD aging inspection tables 30B of the second production processing unit 10B. In addition, it is assumed that the discharge area 5 of the discharge conveyor 4 is capable of accepting the work 1 by the drive of the discharge conveyor 4.

In such a case, the first conveyance pattern in which the discharge area 5 (Number 18) is the conveyance destination is stocked at the top, and simultaneously, the second conveyance pattern in which the discharge area 5 (Number 18) is the conveyance destination is stocked second from the top. Also in such a case, conveyance instructions involving an interference are transmitted to the first robot arm 40A and the second robot arm 40B at different timings.

In the case as described above, first, a conveyance instruction by the first conveyance pattern involving an interference is transmitted to the first robot arm 40A, and the conveyance operation is executed by that conveyance pattern (Step 204 of FIG. 15). On the other hand, first, a conveyance instruction by the second conveyance pattern at the top is transmitted to the second robot arm 40B (Step 304 of FIG. 16), and after the conveyance operation by that conveyance pattern is ended, a conveyance instruction by the second conveyance pattern involving an interference is transmitted (Step 304 of FIG. 16).

When the conveyance operation by the first conveyance pattern involving an interference is already ended at the time the conveyance instruction by the second conveyance pattern involving an interference is output to the second robot arm 40B (NO in Step 306 or NO in Step 307 of FIG. 16), the conveyance operation by the second conveyance pattern involving an interference is executed by the second robot arm 40B. It should be noted that at this time, whether the work 1 is present in the supply area 3 or whether the work 1 is not present in the discharge area 5 is checked.

On the other hand, when the conveyance operation by the first conveyance pattern involving an interference is not yet ended at the time the conveyance instruction by the second conveyance pattern involving an interference is output to the second robot arm 40B (YES in Step 308 of FIG. 16), the conveyance instruction by the second conveyance pattern involving an interference is reset for the second robot arm 40B, and the second conveyance pattern involving an interference is reset (Step 309).

At this time, if a different second conveyance pattern is stocked, a conveyance instruction by that second conveyance pattern is output to the second robot arm 40B. Accordingly, when the conveyance operation involving an interference is started by the first robot arm 40A, the second robot arm 40B can start the next conveyance operation without waiting for the conveyance operation of the first robot arm 40A.

The descriptions above have been given on the case where the first robot arm 40A executes a conveyance operation by the first conveyance pattern involving an interference first. However, it is also possible for the second robot arm 40B to execute a conveyance operation by the second conveyance pattern involving an interference first. In this case, when the conveyance operation involving an interference is started by the second robot arm 40B, the first robot arm 40A can start the next conveyance operation without waiting for the conveyance operation of the second robot arm 40B.

<Operations etc.>

Next, operations and the like of the production processing apparatus 100 of this embodiment will be described.

Figure 17:
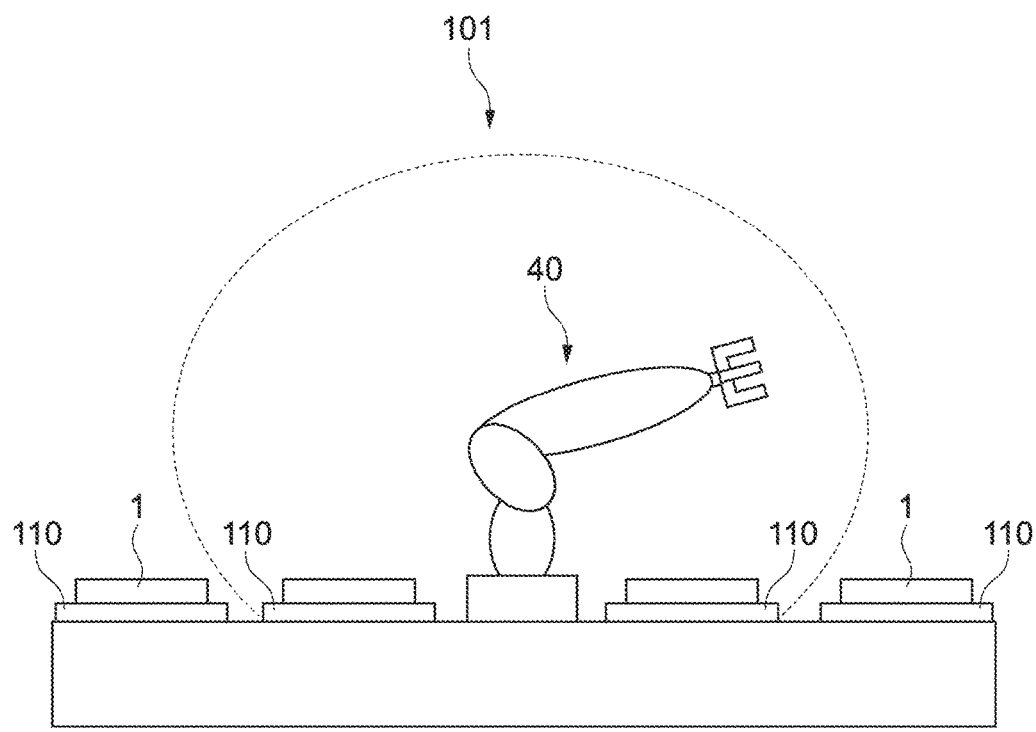
FIG. 17 A schematic side view of a production processing unit according to Comparative Example 1.
Figure 18:
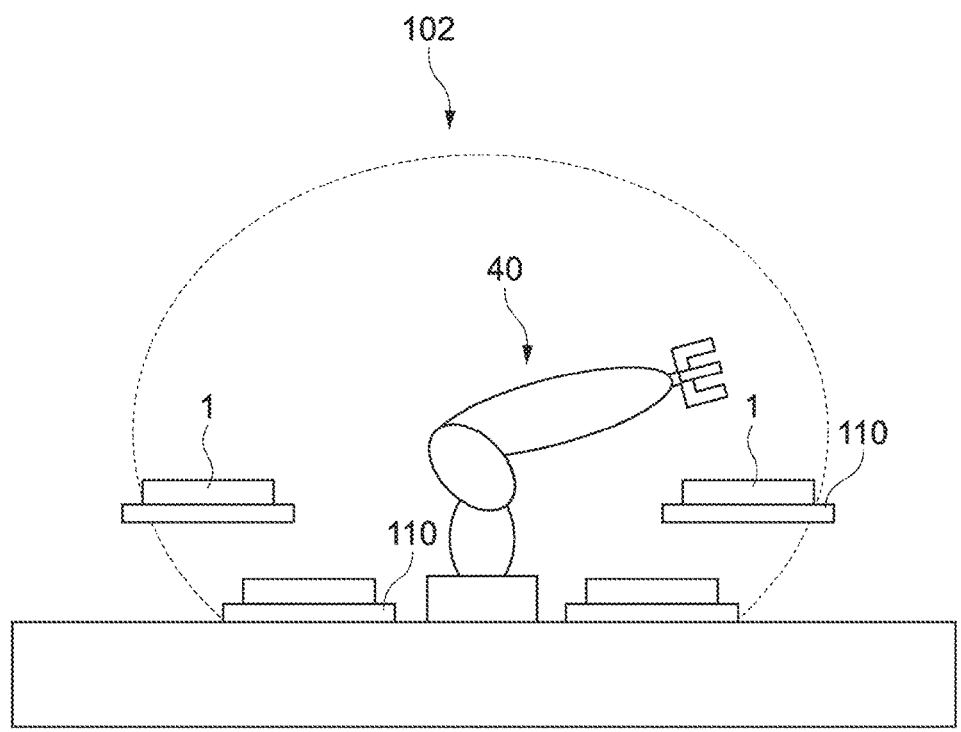
FIG. 18 A schematic side view of the production processing unit according to Comparative Example 2.
Figure 19:
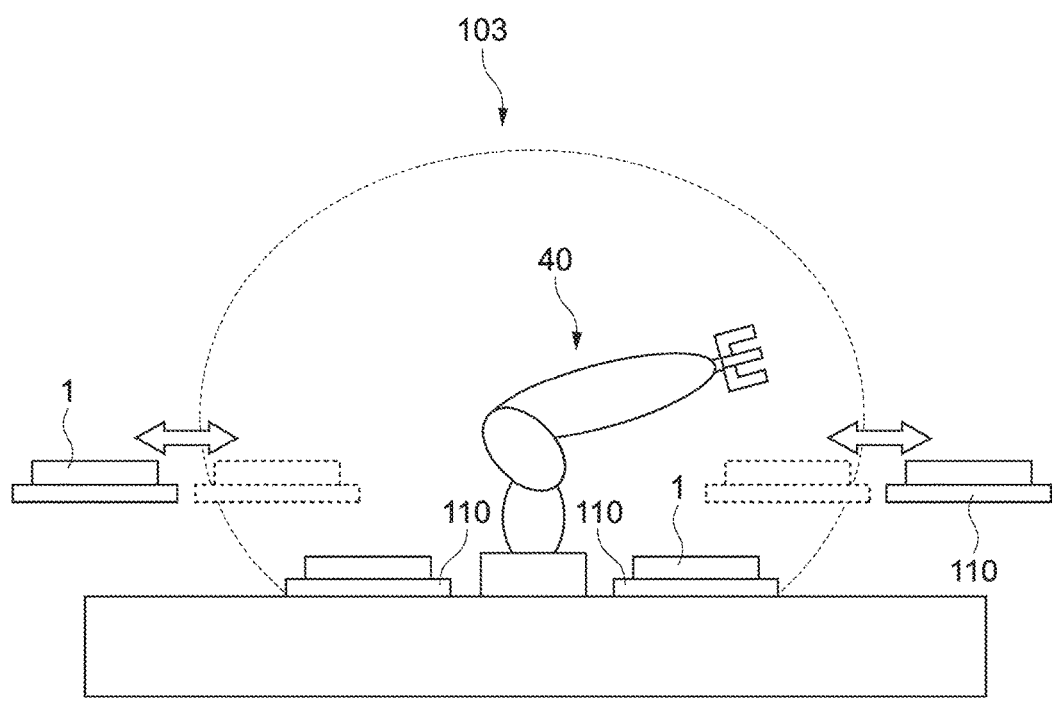
FIG. 19 A schematic side view of the production processing unit according to Comparative Example 3.

FIG. 17 is a schematic side view of a production processing unit 101 according to Comparative Example 1. FIG. 18 is a schematic side view of a production processing unit 102 according to Comparative Example 2. FIG. 19 is a schematic side view of a production processing unit 103 according to Comparative Example 3.

Although the table arrangements of Comparative Examples 1, 2, and 3 differ from that of the production processing apparatus 100 of this embodiment, the configuration of the robot arms 40 is the same. In FIGS. 17, 18, and 19, a movable range of the robot arm 40 is indicated by broken lines.

With reference to FIG. 17, in Comparative Example 1, tables 110 are all arranged in parallel with the horizontal surface and are all arranged at the same height. In this case, a part of the tables 110 does not fit in the movable range of the robot arm 40. For fitting all the tables 110 within the movable range of the robot arm 40, the robot arm 40 needs to be increased in size, which causes an increase in costs. In addition, the arrangement space of the tables 110 becomes large, and the entire production processing apparatus 100 becomes large.

With reference to FIG. 18, in Comparative Example 2, all the tables 110 are arranged in parallel with the horizontal surface, and the tables 110 positioned far from the robot arm 40 is set to be higher than those positioned close to the robot arm 40. By arranging a part of the tables 110 at high positions as in Comparative Example 2, all the tables 110 can fit in the movable range of the robot arm 40.

In Comparative Example 2, however, the tables 110 at the high positions become an obstacle when the robot arm 40 accesses the tables 110 at the low positions.

With reference to FIG. 19, in Comparative Example 3, the tables 110 arranged at high positions are configured to be movable in the horizontal direction (other points are the same as in Comparative Example 2). In Comparative Example 3, it is possible to prevent the tables 110 at the high positions from becoming an obstacle when the robot arm 40 accesses the tables 110 at the low positions.

In Comparative Example 3, however, efficiency of the conveyance operation of the work 1 is lowered, and control becomes complicated. Further, a mechanism for moving the tables 110 becomes necessary, to thus lead to an increase in costs.

On the other hand, in the production processing apparatus 100 of this embodiment, the tables 30 positioned far from the robot arm 40 are arranged on a circumference of a circle about the robot arm 40 and are also positioned at higher positions than the tables 20 positioned close to the robot arm 40 as shown in FIGS. 3 and 4. In addition, the tables 30 are tilted a predetermined angle from the horizontal surface. Accordingly, in the production processing apparatus 100 of this embodiment, the entire production processing apparatus 100 can be made compact while appropriately fitting all the tables 20 and 30 within the movable range of the robot arm 40.

Also in this embodiment, the robot arm 40 does not need to be made large, and a mechanism for moving the tables 20 and 30 does not need to be provided, with the result that costs can be reduced.

Here, the effect of miniaturizing the entire production processing apparatus 100 becomes larger as the tilt angle of the tilt tables 30 becomes steeper. On the other hand, stability of the work 1 placed on the tilt tables 30 is lowered. Conversely, while the stability of the work 1 placed on the tilt tables 30 becomes higher as the tilt angle of the tilt tables 30 becomes more gradual, the effect of miniaturizing the entire production processing apparatus 100 becomes small. Comparing them both, an appropriate value of the tilt angle of the tilt tables 30 is 15° or more and 45° or less. It should be noted that a more-appropriate value is 25° or more and 35° or less.

Next, explaining the control of this embodiment, when an interference occurs during the conveyance operation, the conveyance operation of the robot arm 40B out of the two robot arms is interrupted, and a conveyance pattern involving an interference is reset. Then, when there is a stock of a conveyance pattern, a conveyance instruction by that conveyance pattern is output.

By the processing as described above, in this embodiment, when the conveyance operation involving an interference is started by one of the robot arms 40, the other robot arm 40 can start the next conveyance operation without waiting for the conveyance operation of the other one of the robot arms 40. Accordingly, production efficiency is improved.

<Various Modified Examples>

In the descriptions above, the work adjustment processing, the inspection processing, the data writing processing, and the like have been taken as examples of the production processing carried out in the production processing apparatus 100. However, the production processing carried out in the production processing apparatus 100 is not limited to these processing. For example, a work may be processed, assembled, measured, fixed, and the like in the production processing apparatus 100.

In the descriptions above, the configuration in which the production processing units 10 each include the plurality of horizontal tables 20 and the plurality of tilt tables 30 has been described. However, the plurality of horizontal tables 20 may be omitted. In the descriptions above, the configuration in which the robot arms 40 are each provided on a lower side has been described. However, it is also possible to hang the robot arms 40 from a ceiling.

Regarding control of the robot arms 40, in a case where a conveyance instruction is reset, when a conveyance condition for the reset conveyance pattern is satisfied again, processing of preferentially executing a conveyance operation by that conveyance pattern may be executed. For example, regarding a conveyance pattern for which the conveyance instruction has been reset, when the conveyance condition by that conveyance pattern is satisfied again, the PLC 82 stocks that conveyance pattern at a higher position than conveyance patterns that have not been reset. Accordingly, the postponed conveyance pattern is executed preferentially.

Alternatively, the PLC 82 may sequentially stock the reset conveyance patterns from the top in a dedicated area of the storage unit and execute, when the conveyance condition by the corresponding conveyance pattern is satisfied again, processing of preferentially executing conveyance by that reset conveyance pattern.

The present technology may also take the following configurations.

(1) A production processing apparatus, including:
  a first robot arm capable of conveying a work; and
  a plurality of first tilt tables on each of which the work conveyed by the first robot arm can be mounted, the plurality of first tilt tables being tilted a predetermined angle from a horizontal surface at positions on a circumference of a circle with the first robot arm being a center, the work being subjected to production processing in a state where the work is mounted on one of the plurality of first tilt tables.

(2) The production processing apparatus according to (1), further including
  a plurality of first horizontal tables on each of which the work conveyed by the first robot arm can be mounted, the plurality of first horizontal tables being parallel to the horizontal surface at positions closer to the first robot arm than the plurality of first tilt tables, the work being subjected to the production processing in a state where the work is mounted on one of the plurality of first horizontal tables.

(3) The production processing apparatus according to (2), in which
  the plurality of first tilt tables each include a lower-side edge portion, and
  the lower-side edge portions are arranged at higher positions than the plurality of first horizontal tables.

(4) The production processing apparatus according to any one of (1) to (3), in which
  a tilt angle of the plurality of first tilt tables with respect to the horizontal surface is 15° or more and 45° or less.

(5) The production processing apparatus according to any one of (1) to (4), in which
  the plurality of first tilt tables include a plurality of production processing tables on which the work is subjected to different types of production processing.

(6) The production processing apparatus according to (5), further including
  a control unit that controls drive of the first robot arm to convey the work with the production processing table that has ended the production processing on the work being a conveyance source and the production processing table corresponding to unprocessed production processing being a conveyance destination out of the plurality of production processing tables.
(7) The production processing apparatus according to (2) or (3), in which
the plurality of first tilt tables and the plurality of first horizontal tables include a plurality of production processing tables on which the work is subjected to different types of production processing.
(8) The production processing apparatus according to (7), further including
a control unit that controls drive of the first robot arm to convey the work with the production processing table that has ended the production processing on the work being a conveyance source and the production processing table corresponding to unprocessed production processing being a conveyance destination out of the plurality of production processing tables.
(9) The production processing apparatus according to any one of (1) to (8), further including:
a first production processing unit including the first robot arm and the plurality of first tilt tables; and
a second production processing unit including a second robot arm capable of conveying the work and a plurality of second tilt tables on each of which the work conveyed by the second robot arm can be mounted, the plurality of second tilt tables being tilted a predetermined angle from the horizontal surface at positions on a circumference of a circle with the second robot arm being a center, the work being subjected to production processing in a state where the work is mounted on one of the plurality of second tilt tables.
(10) The production processing apparatus according to (9), in which
the second production processing unit further includes a plurality of second horizontal tables on each of which the work conveyed by the second robot arm can be mounted, the plurality of second horizontal tables being parallel to the horizontal surface at positions closer to the second robot arm than the plurality of second tilt tables, the work being subjected to the production processing in a state where the work is mounted on one of the plurality of second horizontal tables.
(11) The production processing apparatus according to (9) or (10), further including:
a storage unit; and
a control unit that
successively stocks, in the storage unit every time a conveyance condition is satisfied, a first conveyance pattern in which information on a conveyance source from which the work is taken out by the first robot arm and information on a conveyance destination on which the work is mounted by the first robot arm are associated with each other,
successively stocks, in the storage unit every time the conveyance condition is satisfied, a second conveyance pattern in which information on a conveyance source from which the work is taken out by the second robot arm and information on a conveyance destination on which the work is mounted by the second robot arm are associated with each other,
determines whether an interference, in which the conveyance source of the first conveyance pattern and the conveyance source of the second conveyance pattern are the same or the conveyance destination of the first conveyance pattern and the conveyance destination of the second conveyance pattern are the same, has occurred, and causes, when the interference has occurred, the first robot arm to execute conveyance by the first conveyance pattern involving the interference, deletes the second conveyance pattern involving the interference from the storage unit, and causes the second robot arm to execute conveyance by other second conveyance patterns stocked in the storage unit.
(12) The production processing apparatus according to (11), further including:
a supply unit including a supply area for commonly supplying the work to the first production processing unit and the second production processing unit; and
a discharge unit including a discharge area for commonly discharging the work that has ended the production processing in the first production processing unit and the work that has ended the production processing in the second production processing unit,
in which the control unit determines that the interference has occurred when the supply area is commonly set as the conveyance source in the first conveyance pattern and the second conveyance pattern or when the discharge area is commonly set as the conveyance destination in the first conveyance pattern and the second conveyance pattern.
(13) The production processing apparatus according to (11) or (12), in which
the control unit determines whether the first conveyance pattern is stocked in the storage unit, executes a search on whether an executable first conveyance pattern exists when the first conveyance pattern is not stocked in the storage unit, and stocks, when the executable first conveyance pattern exists, the first conveyance pattern in the storage unit and causes the first robot arm to execute conveyance by the first conveyance pattern.
(14) The production processing apparatus according to any one of (11) to (13), in which
the control unit determines whether the second conveyance pattern is stocked in the storage unit, executes a search on whether an executable second conveyance pattern exists when the second conveyance pattern is not stocked in the storage unit, and stocks, when the executable second conveyance pattern exists, the second conveyance pattern in the storage unit and causes the second robot arm to execute conveyance by the second conveyance pattern.
(15) A production processing method, including:
holding a work by a first robot arm;
mounting the work held by the first robot arm on any of a plurality of first tilt tables that are tilted a predetermined angle from a horizontal surface at positions on a circumference of a circle with the first robot arm being a center; and
subjecting the work mounted on the first tilt table to production processing.
(16) A program that causes a production processing apparatus to execute the steps of:
holding a work by a first robot arm;
mounting the work held by the first robot arm on any of a plurality of first tilt tables that are tilted a predetermined angle from a horizontal surface at positions on a circumference of a circle with the first robot arm being a center; and
subjecting the work mounted on the first tilt table to production processing.
(17) A work manufacturing method, including:
holding a work by a first robot arm;

mounting the work held by the first robot arm on any of a plurality of first tilt tables that are tilted a predetermined angle from a horizontal surface at positions on a circumference of a circle with the first robot arm being a center; and subjecting the work mounted on the first tilt table to production processing.

REFERENCE SIGNS LIST 1 work
2 supply conveyor
4 discharge conveyor
10 production processing unit
20 horizontal table
30 tilt table
40 robot arm
66 inspection control PC
82 PLC
100 production processing apparatus

The invention claimed is:

1. A production processing apparatus, comprising:
a first robot arm capable of conveying a work;
a plurality of first tilt tables on each of which the work conveyed by the first robot arm is mountable,
wherein the plurality of first tilt tables is tilted at a first angle from a horizontal surface at first positions on a circumference of a first circle with the first robot arm as a center, and
wherein the work is subjected to production processing in a first state where the work is mounted on one of the plurality of first tilt tables; and
a plurality of first horizontal tables on each of which the work conveyed by the first robot arm is mountable,
wherein the plurality of first horizontal tables is parallel to the horizontal surface at positions closer to the first robot arm than the plurality of first tilt tables, and
wherein the work is subjected to the production processing in a second state where the work is mounted on one of the plurality of first horizontal tables.

2. The production processing apparatus according to claim 1, wherein
each first tilt table of the plurality of first tilt tables includes a lower-side edge portion, and
lower-side edge portions of the plurality of first tilt tables are arranged at higher positions than the plurality of first horizontal tables.

3. The production processing apparatus according to claim 1, wherein the first angle of the tilt of the plurality of first tilt tables with respect to the horizontal surface is 15° or more and 45° or less.

4. The production processing apparatus according to claim 1, wherein the plurality of first tilt tables includes a plurality of production processing tables on which the work is subjected to different types of the production processing.

5. The production processing apparatus according to claim 4, further comprising
a control unit configured to control drive of the first robot arm to convey the work from a first production processing table of the plurality of production processing tables to a second production processing table of the plurality of production processing tables,
wherein the first production processing table that has ended the production processing on the work is a conveyance source and the second production processing table corresponding to unprocessed production processing is a conveyance destination.

6. The production processing apparatus according to claim 1, wherein the plurality of first tilt tables and the plurality of first horizontal tables include a plurality of production processing tables on which the work is subjected to different types of the production processing.

7. The production processing apparatus according to claim 6, further comprising
a control unit configured to control drive of the first robot arm to convey the work from a first production processing table of the plurality of production processing tables to a second production processing table of the plurality of production processing tables,
wherein the first production processing table that has ended the production processing on the work is a conveyance source and the second production processing table corresponding to unprocessed production processing is a conveyance destination.

8. The production processing apparatus according to claim 1, further comprising:
a first production processing unit including:
the first robot arm; and
the plurality of first tilt tables; and
a second production processing unit including:
a second robot arm capable of conveying the work; and
a plurality of second tilt tables on each of which the work conveyed by the second robot arm is mountable,
wherein the plurality of second tilt tables is tilted at a second angle from the horizontal surface at second positions on a circumference of a second circle with the second robot arm as a center, and
wherein the work is subjected to the production processing in a third state where the work is mounted on one of the plurality of second tilt tables.

9. The production processing apparatus according to claim 8, wherein the second production processing unit further includes
a plurality of second horizontal tables on each of which the work conveyed by the second robot arm is mountable,
wherein the plurality of second horizontal tables is parallel to the horizontal surface at positions closer to the second robot arm than the plurality of second tilt tables, and
the work is subjected to the production processing in a fourth state where the work is mounted on one of the plurality of second horizontal tables.

10. The production processing apparatus according to claim 8, further comprising:
a storage unit; and
a control unit configured to:
successively store a first conveyance pattern in the storage unit based on satisfaction of a conveyance condition,
wherein the first conveyance pattern includes first information on a first conveyance source from which the work is taken out by the first robot arm and second information on a first conveyance destination on which the work is mounted by the first robot arm, and
wherein the first information and the second information are associated with each other;
successively store a second conveyance pattern in the storage unit based on satisfaction of the conveyance condition,
wherein the second conveyance pattern includes third information on a second conveyance source from which the work is taken out by the second robot arm and fourth information on a second conveyance destination on which the work is mounted by the second robot arm, and
wherein the third information and the fourth information are associated with each other; and
determine occurrence of an interference in which the first conveyance source of the first conveyance pattern and the second conveyance source of the second conveyance pattern are same or the first conveyance destination of the first conveyance pattern and the second conveyance destination of the second conveyance pattern are same,
wherein based on the occurrence of the interference the control unit is further configured to:
control the first robot arm to execute conveyance by the first conveyance pattern involving the interference;
delete the second conveyance pattern involving the interference from the storage unit; and
control the second robot arm to execute the conveyance by other conveyance patterns stored in the storage unit.

11. The production processing apparatus according to claim 10, further comprising:
a supply unit including a supply area configured to commonly supply the work to the first production processing unit and the second production processing unit; and
a discharge unit including a discharge area configured to commonly discharge the work that has ended the production processing in the first production processing unit and the work that has ended the production processing in the second production processing unit,
wherein the control unit is further configured to determine the occurrence of the interference based on the supply area commonly set as the first conveyance source in the first conveyance pattern and as the second conveyance source in the second conveyance pattern or based on the discharge area commonly set as the first conveyance destination in the first conveyance pattern and as the second conveyance destination in the second conveyance pattern.

12. The production processing apparatus according to claim 10, wherein the control unit is further configured to:
determine storage of the first conveyance pattern in the storage unit;
search for existence of an executable first conveyance pattern based on non-storage of the first conveyance pattern in the storage unit;
store the executable first conveyance pattern in the storage unit based on the existence of the executable first conveyance pattern; and
control the first robot arm to execute the conveyance based on the executable first conveyance pattern.

13. The production processing apparatus according to claim 10, wherein the control unit is further configured to:
determine storage of the second conveyance pattern in the storage unit;
search for existence of an executable second conveyance pattern based on non-storage of the second conveyance pattern in the storage unit;
store the executable second conveyance pattern in the storage unit based on the existence of the executable second conveyance pattern; and
control the second robot arm to execute the conveyance based on the executable second conveyance pattern.

14. A production processing method, comprising:
holding a work by a robot arm;
mounting the work held by the robot arm on a tilt table of a plurality of tilt tables,
wherein the plurality of tilt tables is tilted at an angle from a horizontal surface at positions on a circumference of a circle with the robot arm as a center;
subjecting the work mounted on the tilt table to production processing;
mounting the work held by the robot arm on a horizontal table of a plurality of horizontal tables,
wherein the plurality of horizontal tables is parallel to the horizontal surface at positions closer to the robot arm than the plurality of tilt tables; and
subjecting the work mounted on the horizontal table to the production processing.

15. A non-transitory computer-readable medium having stored thereon, computer-executable instructions which, when executed by a computer, cause the computer to execute operations, the operations comprising:
holding a work by a robot arm;
mounting the work held by the robot arm on a tilt table of a plurality of tilt tables,
wherein the plurality of tilt tables is tilted at an angle from a horizontal surface at positions on a circumference of a circle with the robot arm as a center;
subjecting the work mounted on the tilt table to production processing;
mounting the work held by the robot arm on a horizontal table of a plurality of horizontal tables,
wherein the plurality of horizontal tables is parallel to the horizontal surface at positions closer to the robot arm than the plurality of tilt tables; and
subjecting the work mounted on the horizontal table to the production processing.

16. A work manufacturing method, comprising:
holding a work by a robot arm;
mounting the work held by the robot arm on a tilt table of a plurality of tilt tables,
wherein the plurality of tilt tables is tilted at an angle from a horizontal surface at positions on a circumference of a circle with the robot arm as a center;
subjecting the work mounted on the tilt table to production processing;
mounting the work held by the robot arm on a horizontal table of a plurality of horizontal tables,
wherein the plurality of horizontal tables is parallel to the horizontal surface at positions closer to the robot arm than the plurality of tilt tables; and
subjecting the work mounted on the horizontal table to the production processing.

17. A production processing apparatus, comprising:
a first production processing unit comprising:
a first robot arm capable of conveying a work; and
a plurality of first tilt tables on each of which the work conveyed by the first robot arm is mountable,
wherein the plurality of first tilt tables is tilted at a first angle from a horizontal surface at first positions on a circumference of a first circle with the first robot arm as a center, and
wherein the work is subjected to production processing in a first state where the work is mounted on one of the plurality of first tilt tables; and
a second production processing unit comprising:
a second robot arm capable of conveying the work; and a plurality of second tilt tables on each of which the work conveyed by the second robot arm is mountable, wherein the plurality of second tilt tables is tilted at a second angle from the horizontal surface at second positions on a circumference of a second circle with the second robot arm as a center, and wherein the work is subjected to the production processing in a second state where the work is mounted on one of the plurality of second tilt tables.

* * * * *